United States Patent
More et al.

(10) Patent No.: US 12,125,915 B2
(45) Date of Patent: Oct. 22, 2024

(54) SOURCE/DRAIN FEATURES OF MULTI-GATE DEVICES

(71) Applicant: Taiwan Semiconductor Manufacturing Company, Ltd., Hsinchu (TW)

(72) Inventors: Shahaji B. More, Hsinchu (TW); Cheng-Han Lee, New Taipei (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 408 days.

(21) Appl. No.: 17/581,300

(22) Filed: Jan. 21, 2022

(65) Prior Publication Data

US 2023/0114789 A1    Apr. 13, 2023

Related U.S. Application Data

(60) Provisional application No. 63/255,200, filed on Oct. 13, 2021.

(51) Int. Cl.
*H01L 29/786*    (2006.01)
*H01L 21/02*    (2006.01)
(Continued)

(52) U.S. Cl.
CPC .. *H01L 29/78618* (2013.01); *H01L 21/02532* (2013.01); *H01L 21/0259* (2013.01);
(Continued)

(58) Field of Classification Search
CPC .................................................. H01L 29/42392
See application file for complete search history.

(56) References Cited

U.S. PATENT DOCUMENTS 9,754,840 B2    9/2017    Lin et al.
9,818,872 B2    11/2017    Ching et al.
(Continued)

OTHER PUBLICATIONS

Feng-Ching Chu et al., Expitaxial Features, U.S. Appl. No. 17/321,996, filed May 17, 2021, Assignee: Taiwan Semiconductor Manufacturing Co., Ltd., 31 pages specification, 27 drawings.

*Primary Examiner* — Yu-Hsi D Sun
(74) *Attorney, Agent, or Firm* — HAYNES AND BOONE, LLP

(57) ABSTRACT

Methods and semiconductor structures are provided. A method according to the present disclosure includes forming, over a substrate, a fin-shaped structure that includes a plurality of channel layers interleaved by a plurality of sacrificial layers, recessing a source/drain region of the fin-shaped structure to form a source/drain recess that extends into the substrate and exposes a portion of the substrate, selectively and partially recessing sidewalls of the plurality of sacrificial layers to form inner spacer recesses, forming inner spacers in the inner spacer recesses, selectively forming a buffer semiconductor layer on the exposed portion of the substrate, selectively depositing a first epitaxial layer on sidewalls of the plurality of channel layer and the buffer semiconductor layer such that a top surface of the buffer semiconductor layer is completely covered by the first epitaxial layer, and depositing a second epitaxial layer over the first epitaxial layer and the inner spacers.

20 Claims, 24 Drawing Sheets

(51) Int. Cl.
*H01L 29/06* (2006.01)
*H01L 29/423* (2006.01)
*H01L 29/66* (2006.01)

(52) U.S. Cl.
CPC .... *H01L 29/0665* (2013.01); *H01L 29/42392* (2013.01); *H01L 29/66545* (2013.01); *H01L 29/66553* (2013.01); *H01L 29/66742* (2013.01); *H01L 29/78696* (2013.01)

(56) References Cited

U.S. PATENT DOCUMENTS

| | | |
|---|---|---|
| 10,032,627 B2 | 7/2018 | Lee et al. |
| 10,290,546 B2 | 5/2019 | Chiang et al. |
| 10,475,902 B2 | 11/2019 | Lee et al. |
| 10,950,731 B1 | 3/2021 | Peng et al. |
| 11,031,292 B2 | 6/2021 | Ju et al. |
| 2017/0358500 A1 | 12/2017 | Lin |
| 2018/0151438 A1* | 5/2018 | Chiang ............... H01L 29/4966 |
| 2019/0198645 A1* | 6/2019 | Cheng ............... H01L 29/66742 |
| 2021/0313452 A1* | 10/2021 | Cheng ............... H01L 29/42392 |
| 2023/0063463 A1* | 3/2023 | Chen ............... H01L 29/66795 |

* cited by examiner

SOURCE/DRAIN FEATURES OF MULTI-GATE DEVICES

PRIORITY DATA

This application claims priority to U.S. Provisional Patent Application No. 63/255,200, filed Oct. 13, 2021, the entirety of which is hereby incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Multi-bridge-channel (MBC) transistors are examples of multi-gate devices that have become popular and promising candidates for high performance and low leakage applications. An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

To improve performance of an MBC transistor, efforts are invested to develop epitaxial features that reduce leakage, capacitance and resistance. While conventional epitaxial features are generally adequate to their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
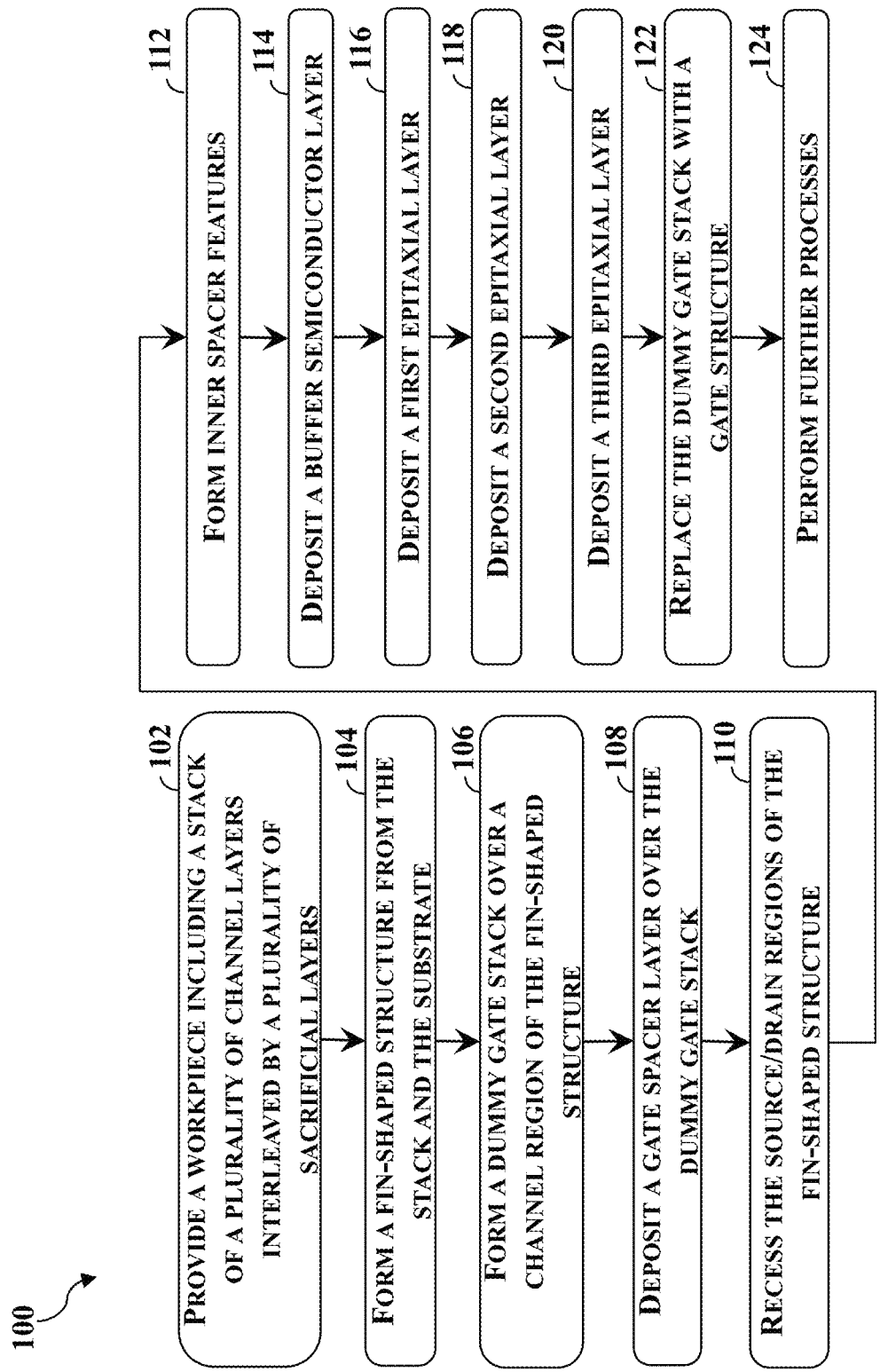
FIG. 1 illustrates a flowchart of a method for forming a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to multi-gate transistors and fabrication methods, and more particularly to source/drain features of MBC transistors. Channel regions of an MBC transistor may be disposed in nanowire channel members, bar-shaped channel members, nanosheet channel members, nanostructure channel members, column-shaped channel members, post-shaped channel members, and/or other suitable channel configurations. Depending on the shapes of the channel members, MBC transistors may also be referred to as nanowire transistors or nanosheet transistors. Despite of the shapes, each of the channel members of an MBC transistor extend between and are coupled to two source/drain features. According to embodiments of the present disclosure, each of the source/drain features is disposed on an undoped semiconductor feature in a source/drain recess. Each of the source/drain feature includes a shielding epitaxial layer that completely covers the undoped semiconductor feature and sidewalls of the channel members and a heavily doped epitaxial layer disposed over the shielding epitaxial layer. The heavily doped epitaxial layer is spaced apart from the undoped semiconductor feature by the shielding epitaxial layer. A capping epitaxial layer may be formed over the heavily doped epitaxial layer to protect the same. The shielding epitaxial layer may include a cone-like top surface or a substantially flat top surface. Embodiments of the present disclosure reduce void formation in the source/drain features and contact resistance.

The various aspects of the present disclosure will now be described in more detail with reference to the figures. In that regard, FIG. 1 is a flowchart illustrating a method 100 of forming a semiconductor structure from a workpiece according to embodiments of the present disclosure. Method 100 is merely an example and is not intended to limit the present disclosure to what is explicitly illustrated in method 100. Additional steps can be provided before, during and after the method 100, and some steps described can be replaced, eliminated, or moved around for additional embodiments of the method. Not all steps are described herein in detail for reasons of simplicity. Method 100 is described below in conjunction with FIG. 2-24, which are fragmentary cross-sectional views of workpiece 200 at different stages of fabrication according to embodiments of the method 100 in FIG. 1. Because the workpiece 200 will be fabricated into a semiconductor structure or a semiconductor device, the workpiece 200 may be referred to herein as a semiconductor structure or a semiconductor device 200 as the context requires. For avoidance, the X, Y and Z directions in FIGS. 2-24 are perpendicular to one another. Throughout the present disclosure, unless expressly otherwise described, like reference numerals denote like features.

Figure 2:
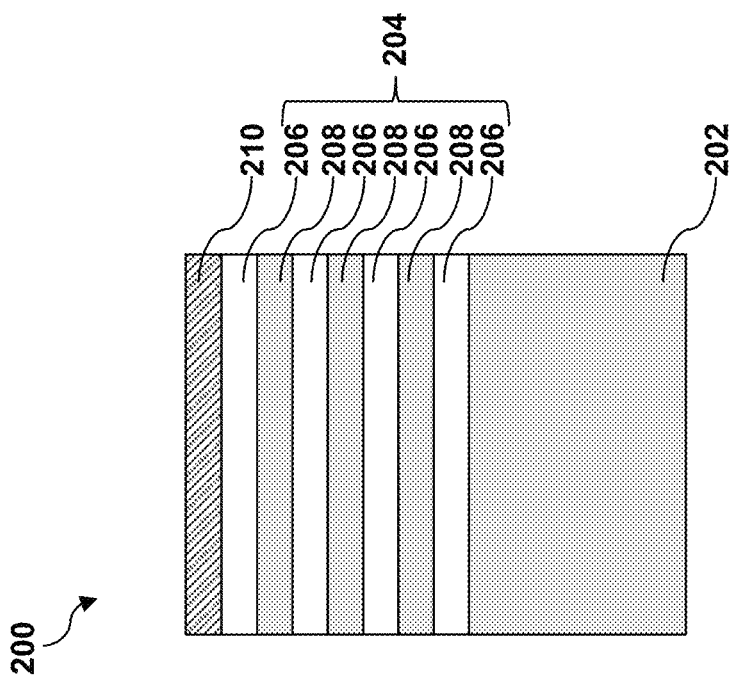
FIGS. 2-24 illustrate fragmentary cross-sectional views of a workpiece during a fabrication process according to the method of FIG. 1, according to one or more aspects of the present disclosure.

Referring to FIGS. 1 and 2, method 100 includes a block 102 where a stack 204 of alternating semiconductor layers is formed over the workpiece 200. As shown in FIG. 2, the workpiece 200 includes a substrate 202. In some embodiments, the substrate 202 may be a semiconductor substrate such as a silicon (Si) substrate. The substrate 202 may include various doping configurations depending on design requirements as is known in the art. In embodiments where the semiconductor device is p-type, an n-type doping profile (i.e., an n-type well or n-well) may be formed on the substrate 202. In some implementations, the n-type dopant for forming the n-type well may include phosphorus (P) or arsenic (As). In embodiments where the semiconductor device is n-type, a p-type doping profile (i.e., a p-type well or p-well) may be formed on the substrate 202. In some implementations, the p-type dopant for forming the p-type well may include boron (B) or gallium (Ga). The suitable doping may include ion implantation of dopants and/or diffusion processes. The substrate 202 may also include other semiconductors such as germanium (Ge), silicon carbide (SiC), silicon germanium (SiGe), germanium tin (GeSn), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) or a germanium-on-insulator (GeOI) structure, and/or may have other suitable enhancement features.

In some embodiments, the stack 204 includes sacrificial layers 206 of a first semiconductor composition interleaved by channel layers 208 of a second semiconductor composition. It can also be said that the channel layers 208 are interleaved by the sacrificial layers 206. The first and second semiconductor composition may be different. In some embodiments, the sacrificial layers 206 include silicon germanium (SiGe) or germanium tin (GeSn) and the channel layers 208 include silicon (Si). It is noted that four (4) layers of the sacrificial layers 206 and three (3) layers of the channel layers 208 are alternately arranged as illustrated in FIG. 2, which is for illustrative purposes only and not intended to be limiting beyond what is specifically recited in the claims. It can be appreciated that any number of epitaxial layers may be formed in the stack 204. The number of layers depends on the desired number of channels members for the semiconductor device 200. In some embodiments, the number of channel layers 208 is between 2 and 10. In the embodiments represented in FIG. 2, the stack 204 includes a bottommost sacrificial layer 206 and a topmost sacrificial layer 206. In the embodiments, the topmost sacrificial layer 206 functions to protect the topmost channel layer and may be completely consumed in subsequent processes.

In some embodiments, all sacrificial layers 206 may have a substantially uniform first thickness and all of the channel layers 208 may have a substantially uniform second thickness. The first thickness and the second thickness may be identical or different. As described in more detail below, the channel layers 208 or parts thereof may serve as channel member(s) for a subsequently-formed multi-gate device and the thickness of each of the channel layers 208 is chosen based on device performance considerations. The sacrificial layers 206 in channel regions(s) may eventually be removed and serve to define a vertical distance between adjacent channel members, which are formed from the channel layers 208, for a subsequently-formed multi-gate device and the thickness of each of the sacrificial layers 206 is chosen based on device performance considerations.

The sacrificial layers 206 and channel layers 208 in the stack 204 may be deposited using a molecular beam epitaxy (MBE) process, a vapor phase deposition (VPE) process, and/or other suitable epitaxial growth processes. As stated above, in at least some examples, the sacrificial layers 206 include an epitaxially grown silicon germanium (SiGe) layer and the channel layers 208 include an epitaxially grown silicon (Si) layer. In some embodiments, the sacrificial layers 206 and the channel layers 208 are substantially dopant-free (i.e., having an extrinsic dopant concentration from about 0 atoms/cm$^3$ to about $1 \times 10^{17}$ atoms/cm$^3$), where for example, no intentional doping is performed during the epitaxial growth processes for the stack 204. In some alternative embodiments, the sacrificial layers 206 may include silicon germanium (SiGe) and the channel layers 208 include silicon (Si).

Figure 3:
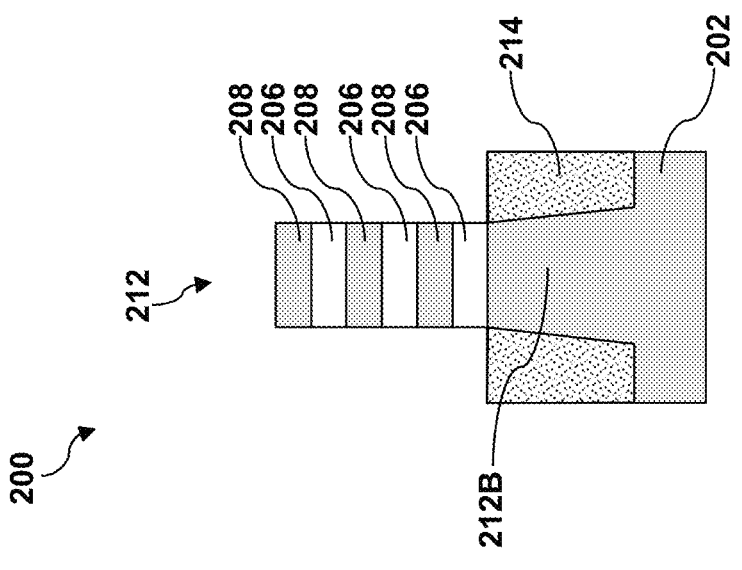

Referring still to FIGS. 1, 2 and 3, method 100 includes a block 104 where a fin-shaped structure 212 is formed from the stack 204 and the substrate 202. To pattern the stack 204, a hard mask layer 210 (shown in FIG. 2) may be deposited over the stack 204 to form an etch mask. The hard mask layer 210 may be a single layer or a multi-layer. For example, the hard mask layer 210 may include a pad oxide layer and a pad nitride layer disposed over the pad oxide layer. The fin-shaped structure 212 may be patterned from the stack 204 and the substrate 202 using a lithography process and an etch process. The lithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etching (e.g., RIE etching), wet etching, and/or other etching methods. As shown in FIG. 3, the etch process at block 104 forms trenches extending vertically through the stack 204 and a portion of the substrate 202. The trenches define the fin-shaped structures 212. In some implementations, double-patterning or multi-patterning processes may be used to define fin-shaped structures that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin-shaped structure 212 by etching the stack 204. As shown in FIG. 3, the fin-shaped structure 212 that includes the sacrificial layers 206 and the channel layers 208 extends vertically along the Z direction and lengthwise along the X direction. As shown in FIG. 3, the fin-shaped structure 212 includes a base fin structure 212B patterned from the substrate 202. The patterned stack 204, including the sacrificial layers 206 and the channel layers 208, is disposed directly over the base fin structure 212B.

An isolation feature 214 is formed adjacent the fin-shaped structure 212. In some embodiments represented in FIG. 3, the isolation feature 214 is disposed on sidewalls of the base fin structure 212B. In some embodiments, the isolation feature 214 may be formed in the trenches to isolate the fin-shaped structures 212 from a neighboring fin-shaped structure. The isolation feature 214 may also be referred to as a shallow trench isolation (STI) feature 214. By way of example, in some embodiments, a dielectric layer is first deposited over the substrate 202, filling the trenches with the dielectric layer. In some embodiments, the dielectric layer may include silicon oxide, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, a spin-on coating process, and/or other suitable process. The deposited dielectric material is then thinned and planarized, for example by a chemical mechanical polishing (CMP) process. The planarized dielectric layer is further recessed or pulled-back by a dry etching process, a wet etching process, and/or a combination thereof to form the STI feature 214 shown in FIG. 3. The fin-shaped structure 212 rises above the STI feature 214 after the recessing, while the base fin structure 212B is embedded or buried in the isolation feature 214.

Figure 4:
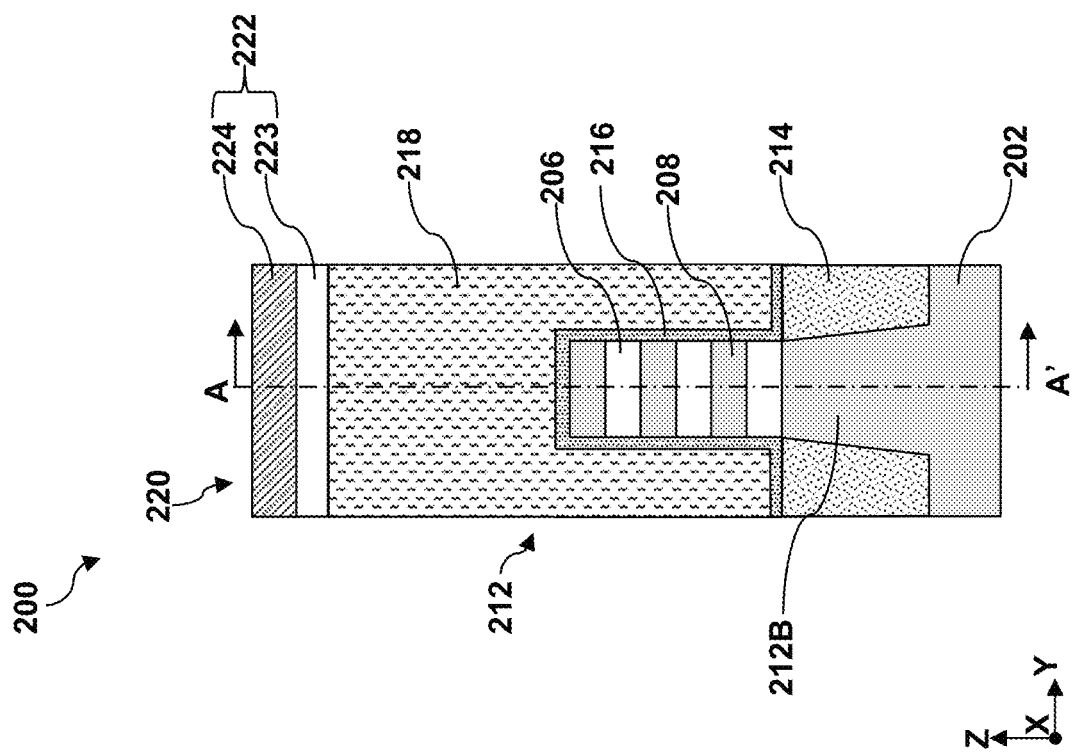
Figure 5:
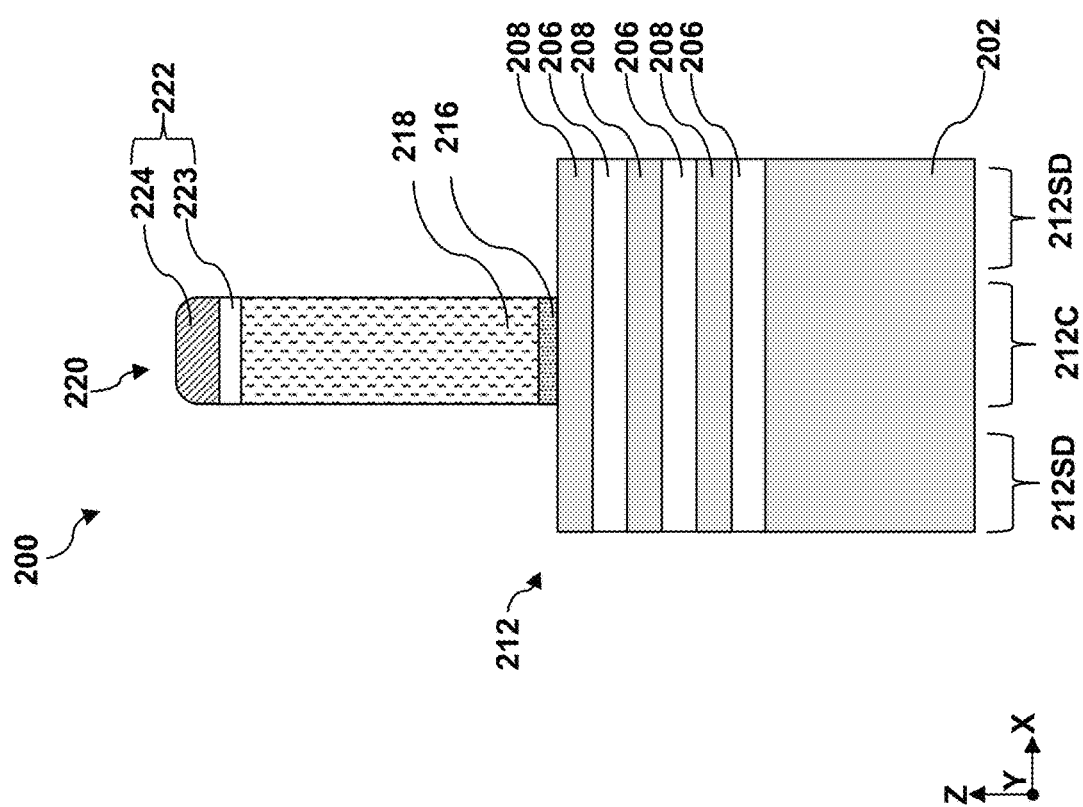

Referring to FIGS. 1, 4 and 5, method 100 includes a block 106 where a dummy gate stack 220 is formed over a channel region 212C of the fin-shaped structure 212. In some embodiments, a gate replacement process (or gate-last process) is adopted where the dummy gate stack 220 (shown in FIGS. 4 and 5) serves as a placeholder to undergo various processes and is to be removed and replaced by a functional gate structure. Other processes and configuration are possible. In some embodiments illustrated in FIG. 5, the dummy gate stack 220 is formed over the fin-shaped structure 212 and the fin-shaped structure 212 may be divided into channel regions 212C underlying the dummy gate stacks 220 and source/drain regions 212SD that do not underlie the dummy gate stacks 220. The channel regions 212C are adjacent the source/drain regions 212SD. As shown in FIG. 5, the channel region 212C is disposed between two source/drain regions 212SD along the X direction.

The formation of the dummy gate stack 220 may include deposition of layers in the dummy gate stack 220 and patterning of these layers. Referring to FIG. 4, a dummy dielectric layer 216, a dummy electrode layer 218, and a gate-top hard mask layer 222 may be blanketly deposited over the workpiece 200. In some embodiments, the dummy dielectric layer 216 may be formed on the fin-shaped structure 212 using a chemical vapor deposition (CVD) process, an ALD process, an oxygen plasma oxidation process, or other suitable processes. In some instances, the dummy dielectric layer 216 may include silicon oxide. Thereafter, the dummy electrode layer 218 may be deposited over the dummy dielectric layer 216 using a CVD process, an ALD process, or other suitable processes. In some instances, the dummy electrode layer 218 may include polysilicon. For patterning purposes, the gate-top hard mask layer 222 may be deposited on the dummy electrode layer 218 using a CVD process, an ALD process, or other suitable processes. The gate-top hard mask layer 222, the dummy electrode layer 218 and the dummy dielectric layer 216 may then be patterned to form the dummy gate stack 220, as shown in FIG. 5. For example, the patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the gate-top hard mask layer 222 may include a silicon oxide layer 223 and a silicon nitride layer 224 over the silicon oxide layer 223. As shown in FIG. 5, the dummy gate stack 220 is patterned such that it is only disposed over the channel region 212C, not disposed over the source/drain region 212SD.

Figure 6:
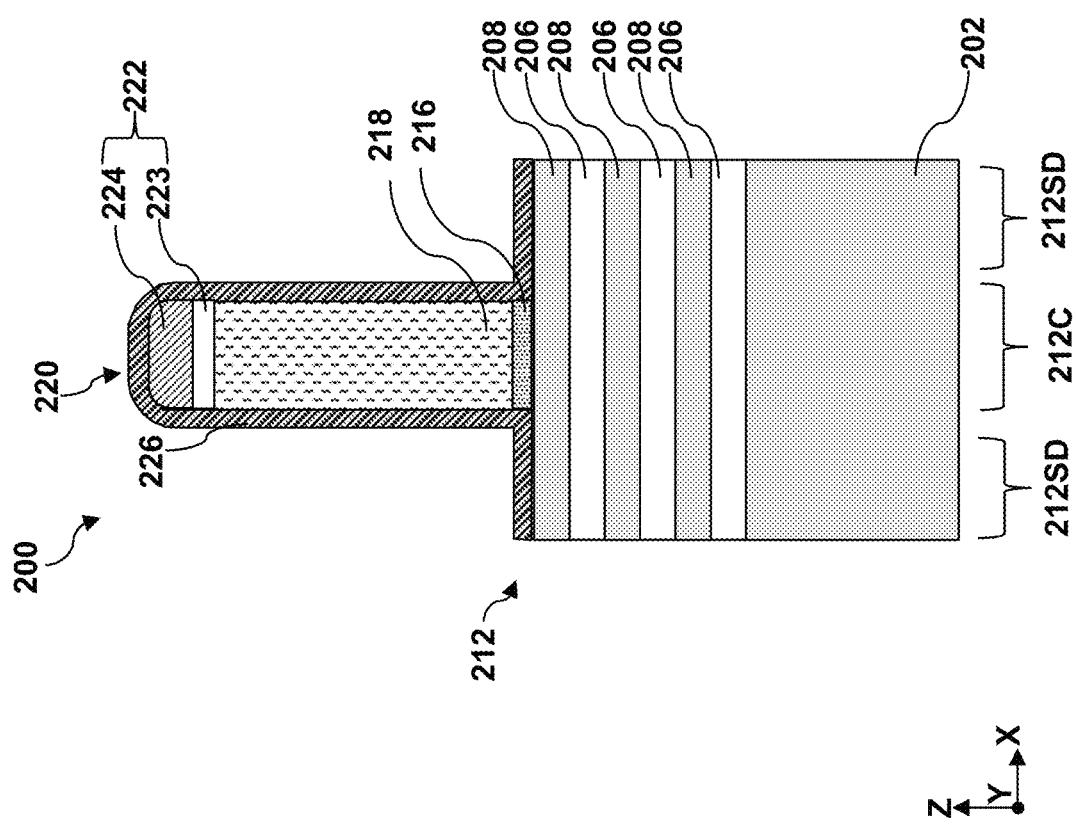

Referring to FIGS. 1 and 6, method 100 includes a block 108 where a gate spacer layer 226 is deposited over the workpiece 200, including over the dummy gate stack 220. In some embodiments, the gate spacer layer 226 is deposited conformally over the workpiece 200, including over top surfaces and sidewalls of the dummy gate stack 220. The term "conformally" may be used herein for case of description of a layer having substantially uniform thickness over various regions. The gate spacer layer 226 may be a single layer or a multi-layer. The at least one layer in the gate spacer layer 226 may include silicon carbonitride, silicon oxycarbide, silicon oxycarbonitride, or silicon nitride. The gate spacer layer 226 may be deposited over the dummy gate stack 220 using processes such as, a CVD process, a subatmospheric CVD (SACVD) process, an ALD process, or other suitable process.

Figure 7:
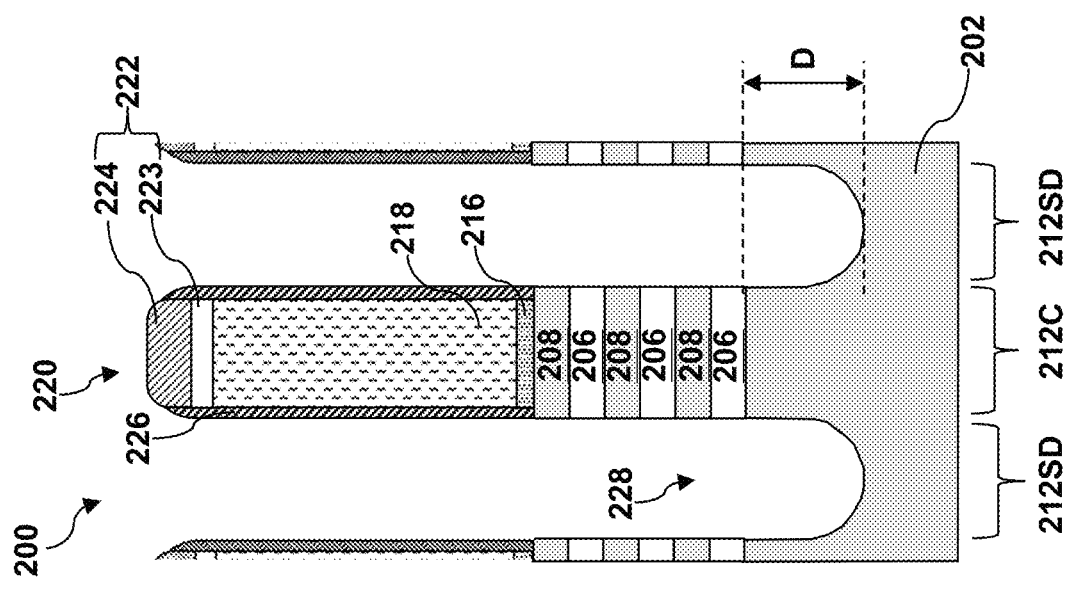

Referring to FIGS. 1 and 7, method 100 includes a block 110 where a source/drain region 212SD of the fin-shaped structure 212 is anisotropically recessed to form a source/drain trench 228. The anisotropic etch may include a dry etch or a suitable etch process that etches the source/drain regions 212SD and a portion of the substrate 202 below the source/drain regions 212SD. The resulting source/drain trench 228 extends vertically through the depth of the stack 204 and partially into the substrate 202. An example dry etch process for block 110 may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$. $CHCl_3$. $CCl_4$, and/or $BCl_3$), a bromine-containing gas (e.g., HBr and/or $CHBr_3$), an iodine-containing gas, other suitable gases and/or plasmas, and/or combinations thereof. As illustrated in FIG. 7, the source/drain regions 212SD of the fin-shaped structure 212 are recessed to expose sidewalls of the sacrificial layers 206 and the channel layers 208. Because the source/drain trenches 228 extend below the stack 204 into the substrate 202, the source/drain trenches 228 include bottom surfaces and lower sidewalls defined in the substrate 202. In some instances, the source/drain trench 228 extends into the substrate 202 by a recess depth D, which is between about 25 nm and about 55 nm.

Figure 8:
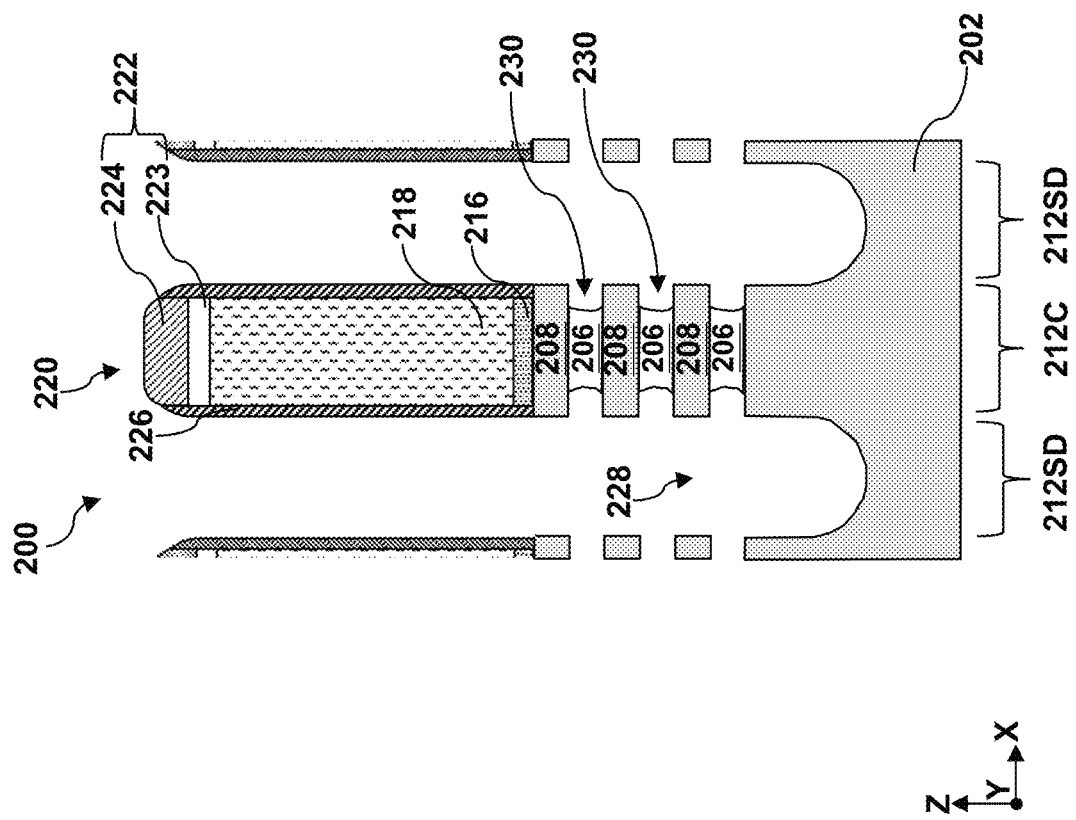
Figure 9:
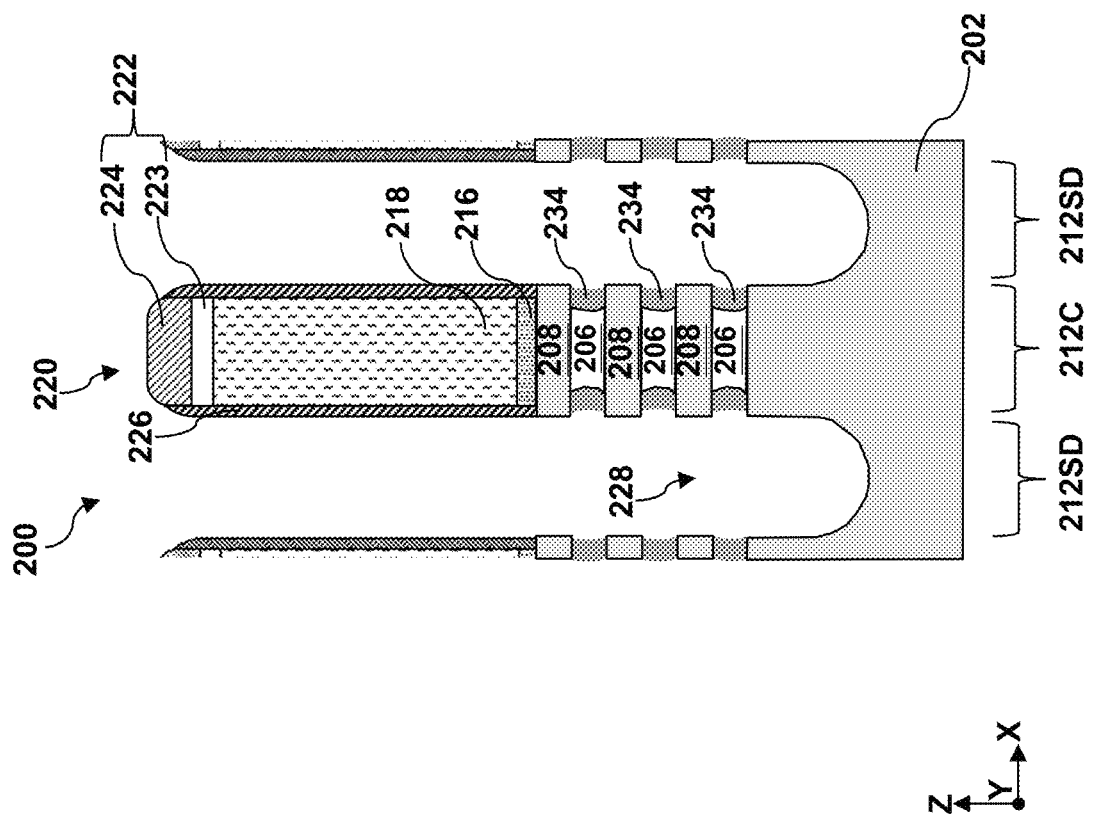

Referring to FIGS. 1, 8 and 9, method 100 includes a block 112 where inner spacer features 234 are formed. While not shown explicitly, operation at block 112 may include selective and partial removal of the sacrificial layers 206 to form inner spacer recesses 230 (shown in FIG. 8), deposition of inner spacer material over the workpiece 200, and etch back the inner spacer material to form inner spacer features 234 in the inner spacer recesses 230 (shown in FIG. 9). Referring to FIG. 8, the sacrificial layers 206 exposed in the source/drain trenches 228 are selectively and partially recessed to form inner spacer recesses 230 while the gate spacer layer 226, the exposed portion of the substrate 202, and the channel layers 208 are substantially unetched. In an embodiment where the channel layers 208 consist essentially of silicon (Si) and sacrificial layers 206 consist essentially of silicon germanium (SiGe), the selective recess of the sacrificial layers 206 may be performed using a selective wet etch process or a selective dry etch process. An example selective dry etching process may include use of one or more fluorine-based etchants, such as fluorine gas or hydrofluorocarbons. An example selective wet etching process may include an APM etch (e.g., ammonia hydroxide-hydrogen peroxide-water mixture).

After the inner spacer recesses 230 are formed, an inner spacer material is deposited over the workpiece 200, including over the inner spacer recesses 230. The inner spacer material may include metal oxides, silicon oxide, silicon oxycarbonitride, silicon nitride, silicon oxynitride, carbon-rich silicon carbonitride, or a low-k dielectric material. The metal oxides may include aluminum oxide, zirconium oxide, tantalum oxide, yttrium oxide, titanium oxide, lanthanum oxide, or other suitable metal oxide. While not explicitly shown, the inner spacer material may be a single layer or a multilayer. In some implementations, the inner spacer material may be deposited using CVD, PECVD, SACVD, ALD or other suitable methods. The inner spacer material is deposited into the inner spacer recesses 230 as well as over the sidewalls of the channel layers 208 exposed in the source/drain trenches 228. Referring to FIG. 9, the deposited inner spacer material is then etched back to remove the inner spacer material from the sidewalls of the channel layers 208 to form the inner spacer features 234 in the inner spacer recesses 230. At block 112, the inner spacer material may also be removed from the top surfaces and/or sidewalls of the gate-top hard mask layer 222 and the gate spacer layer 226. In some implementations, the etch back operations performed at block 112 may include use of hydrogen fluoride (HF), fluorine gas ($F_2$), hydrogen ($H_2$), ammonia ($NH_3$), nitrogen trifluoride ($NF_3$), or other fluorine-based etchants. As shown in FIG. 9, each of the inner spacer features 234 is in direct contact with the recessed sacrificial layers 206 and is disposed vertically (along the Z direction) between two neighboring channel layers 208.

While not explicitly shown, before any of the epitaxial layers are formed, method 100 may include a cleaning process to clean surfaces of the workpiece 200. The cleaning process may include a dry clean, a wet clean, or a combination thereof. In some examples, the wet clean may include use of standard clean 1 (RCA SC-1, a mixture of deionized (DI) water, ammonium hydroxide, and hydrogen peroxide), standard clean 2 (RCA SC-2, a mixture of DI water, hydrochloric acid, and hydrogen peroxide), SPM (a sulfuric peroxide mixture), and/or hydrofluoric acid for oxide removal. The dry clean process may include helium (He) and hydrogen ($H_2$) treatment. The hydrogen treatment may convert silicon on the surface to silane ($SiH_4$), which may be pumped out for removal.

Figure 10:
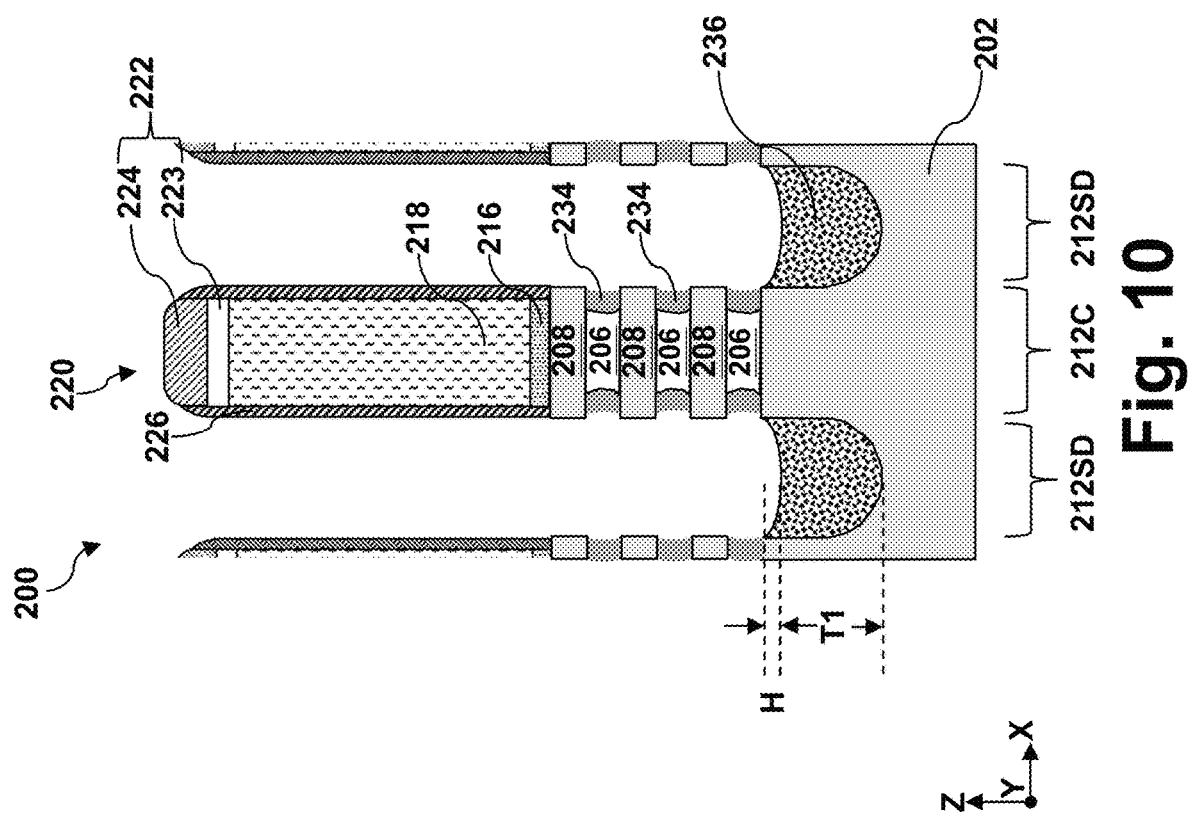

Referring to FIGS. 1 and 10, method 100 includes a block 114 where a buffer semiconductor layer 236 is selectively deposited over surfaces of the substrate 202 exposed in the source/drain trenches 228. The buffer semiconductor layer 236 functions to prevent leakage through the substrate 202. To reduce the conductivity of the buffer semiconductor layer 236, the buffer semiconductor layer 236 is undoped or not intentionally doped. In some embodiments, the buffer semiconductor layer 236 may include undoped silicon (Si), undoped germanium (Ge), undoped silicon germanium (SiGe), or undoped germanium tin (GeSn). At block 114, in order to selectively deposit the buffer semiconductor layer 236 on the substrate 202, the buffer semiconductor layer 236 may be epitaxially deposited over the source/drain trenches 228 using silicon precursors such as silane ($SiH_4$), dichlorosilane ($SiH_2Cl_2$), germanium precursors such as germane ($GeH_4$), and carrier gas such as nitrogen ($N_2$) or hydrogen ($H_2$). Hydrogen chloride (HCl) may be introduced to improve deposition selectivity such that little or no of the buffer semiconductor layer 236 is deposited on sidewalls of the inner spacer features 234, sidewalls of the channel layers 208, sidewalls of the gate spacer layer 226, or a top surface of the gate-top hard mask layer 222. Upon its formation, the buffer semiconductor features 236 are in direct contact with surfaces of the substrate 202 that are exposed in the source/drain trenches 228. In some instances, the buffer semiconductor features 236 may have a fringe height H along the Z direction and the fringe height H is between about 1 nm and about 5 nm. As used herein, the fringe height H refers to a vertical thickness difference between a center region of the buffer semiconductor feature 236 and a fringe (border) region of the buffer semiconductor feature 236. As measured from the center region, the buffer semiconductor feature 236 may have a first thickness (T1) between about 20 nm and about 50 nm. While not explicitly shown in FIG. 10, in some alternative embodiments, top surfaces of the buffer semiconductor features 236 are lower than top surfaces of the isolation feature 214.

Figure 11:
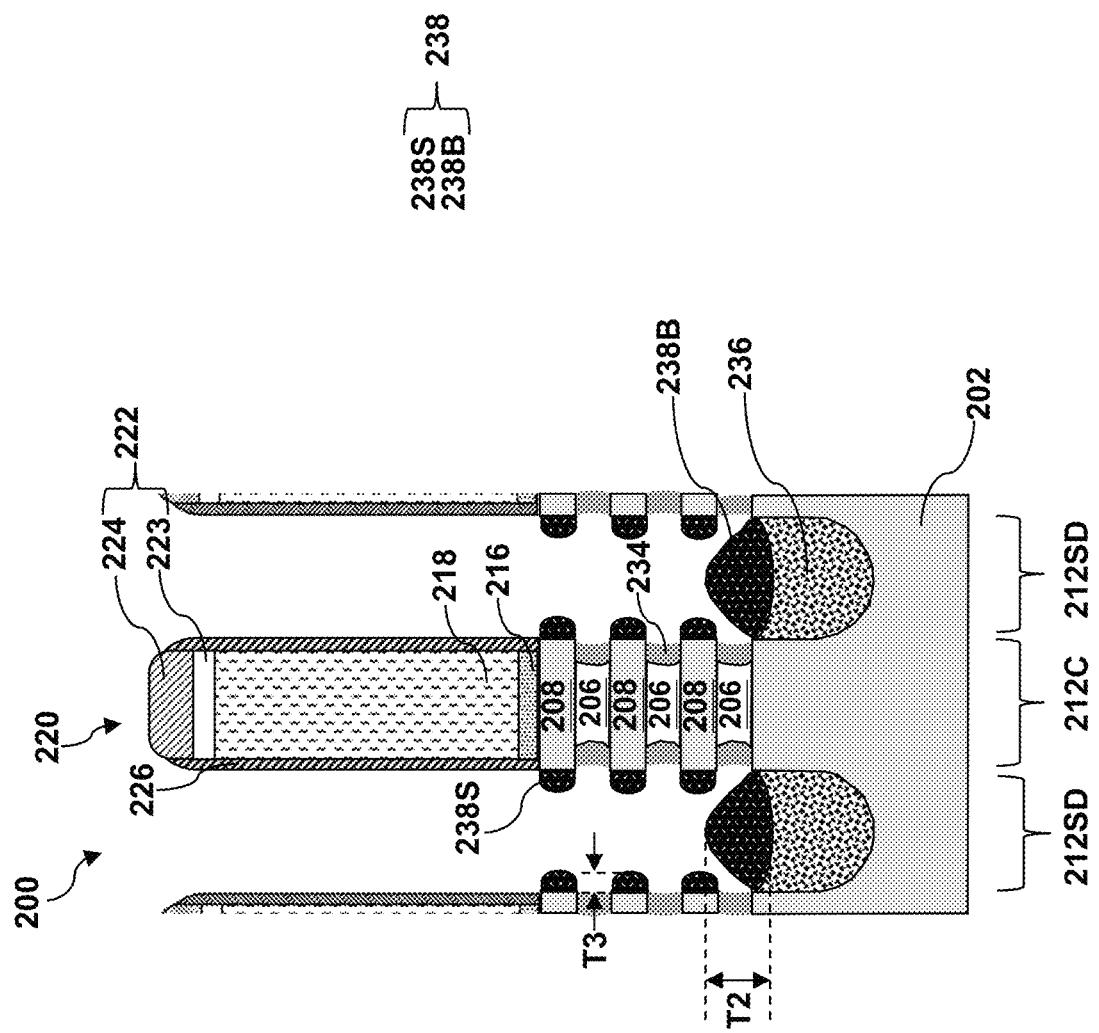

Referring to FIGS. 1 and 11, method 100 includes a block 116 where a first epitaxial layer 238 is selectively deposited over a top surface of the buffer semiconductor features 236 and exposed sidewalls of the channel layer 208. In some embodiments, the deposition of the buffer semiconductor features 236 at block 114 and deposition of the first epitaxial layer 238 at block 116 are performed in separate process chambers to ensure that the buffer semiconductor features 236 are not contaminated by any dopant. That is, after the buffer semiconductor features 236 are formed in a first process chamber, the workpiece 200 is removed from the first process chamber and transported to a different second process chamber for operations at block 116. To ensure selective deposition of the first epitaxial layer 238, the first epitaxial layer 238 may be deposited using a growth-etch deposition process or a cyclic deposition process. As its name suggests, the growth-etch deposition process includes a growth component (or growth cycles) and an etch component (or etch cycles). The growth component (or growth cycles) selectively deposits the first epitaxial layer 238 primarily on semiconductor surfaces and the etch component (or etch cycles) removes the first epitaxial layer 238 deposited on non-semiconductor surfaces. In some embodiments, the selective deposition of the first epitaxial layer 238 includes a process pressure between about 10 Torr and about 300 Torr and a process temperature between about 600° C.

and about 700° C. This process temperature range is not trivial. When the process temperature is below 600° C., the growth rate of the first epitaxial layer may be too slow. When the process temperature is above 700° ° C., the quality of the deposited first epitaxial layer may deteriorate.

In some embodiments, the first epitaxial layer 238 may be in-situ doped with phosphorus (P) or arsenic (As). When the dopant in the first epitaxial layer 238 is phosphorus (P), the growth-etch deposition process includes growth cycles that include use of silane ($SiH_4$), dichlorosilane ($SiH_2Cl_2$), phosphine ($PH_3$), or hydrogen chloride (HCl) and etch cycles that include use of hydrogen chloride (HCl) as an etchant and hydrogen ($H_2$) as a carrier gas. The phosphorus (P) dopant concentration may be between about $1\times10^{20}$ and about $8\times10^{20}$ atoms/cm$^3$. When the dopant in the first epitaxial layer 238 is arsenic (As), the growth-etch deposition process includes growth cycles that include use of silane ($SiH_4$), dichlorosilane ($SiH_2Cl_2$), arsine ($AsH_3$), or hydrogen chloride (HCl) and etch cycles that include use of hydrogen chloride (HCl) as an etchant and hydrogen ($H_2$) as a carrier gas. The arsenic (As) dopant concentration may be between about $5\times10^{20}$ and about $2\times10^{21}$ atoms/cm$^3$. The first epitaxial layer 238 functions as a shielding epitaxial layer that protects the buffer semiconductor layer 236 from dopant diffusion from a second dielectric layer (to be described below). To properly function as a shielding epitaxial layer, the first epitaxial layer 238 is formed such that it completely covers all exposed surfaces of the buffer semiconductor features 236. In some instances, the growth-etch deposition process may include between about 2 and about 5 growth cycles and between about 2 and about 5 etch cycles. In one embodiment, the growth-etch deposition process may include between about 2 and about 3 growth cycles and between about 2 and about 3 etch cycles to achieve satisfactory coverage of the first epitaxial layer 238 over the buffer semiconductor feature 236.

As shown in FIG. 11, when the first epitaxial layer 238 completely covers exposed surfaces of the buffer semiconductor features 236 and fills the fringe height H shown in FIG. 10, the first epitaxial layer 238 includes a bottom portion 238B that is disposed directly on the buffer semiconductor layer 236 and sidewall portions 238S that are disposed directly on sidewalls of the channel layers 208. As shown in FIG. 11, as measured from the buffer semiconductor layer 236, the bottom portion 238B of the first epitaxial layer 238 includes a second thickness T2 between about 5 nm and about 20 nm along the Z direction. As measured from sidewalls of the channel layers 208, each of the sidewall portions 238S includes a third thickness T3 between about 2 nm and about 5 nm. As illustrated in FIG. 11, the bottom portion 238B includes a cone-like profile when viewed along the Y direction. In some instances, a top surface of the bottom portion 238B may be higher than a bottom surface of the bottommost channel layers 208. The bottom portion 238B extends lengthwise along the Y direction for a length between about 20 nm and about 60 nm. As such, the bottom portion 238B is elongated along the Y direction. It is noted that the bottom portion 238B is not in direct contact with the substrate 202.

Figure 12:
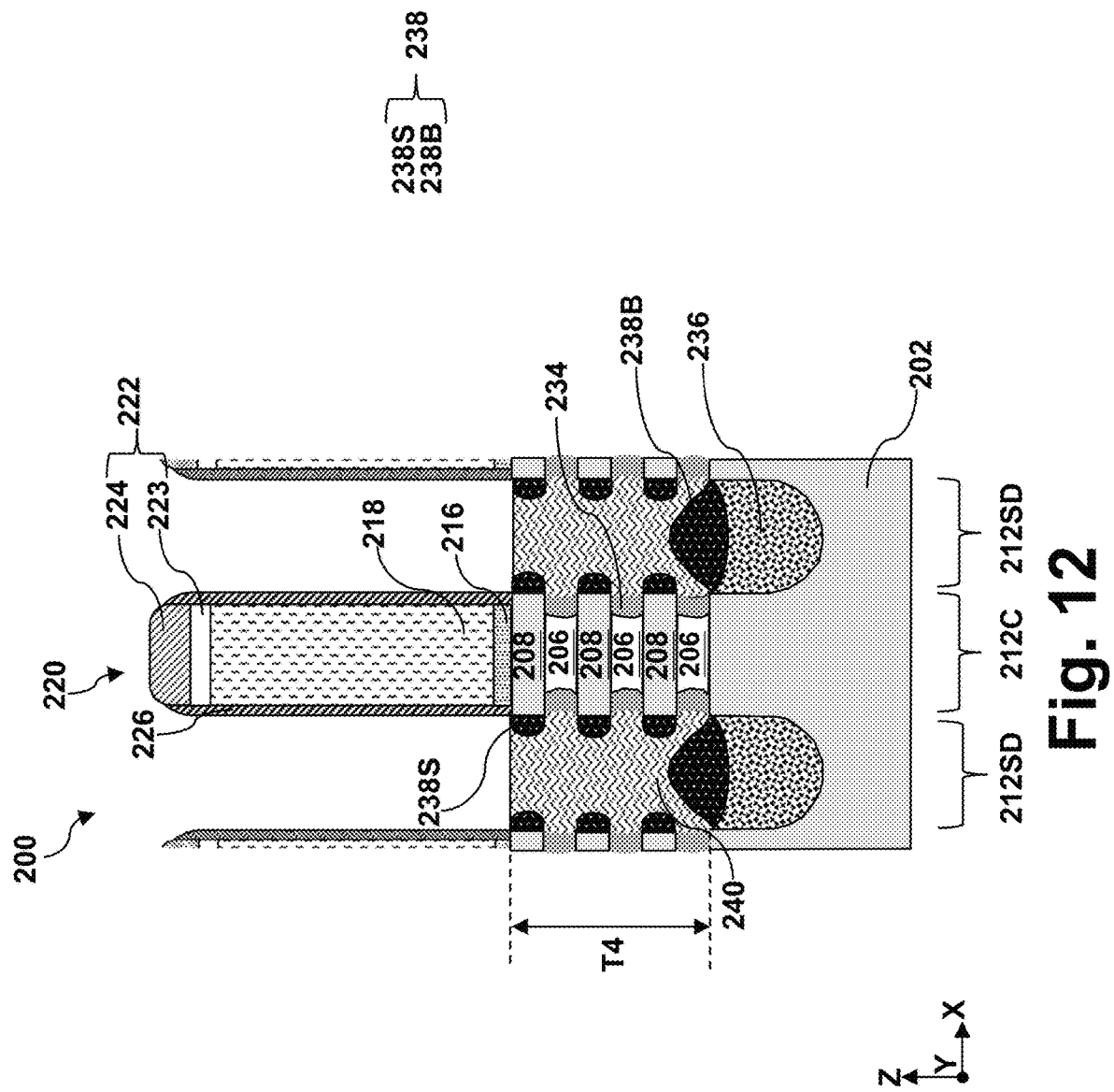

Referring to FIGS. 1 and 12, method 100 includes a block 118 where a second epitaxial layer 240 is deposited over surfaces of the first epitaxial layer 238 and the inner spacer features 234. In some embodiments, the deposition of the first epitaxial layer 238 at block 116 and the deposition of the second epitaxial layer 240 are performed in situ in the same process chambers as there are less dopant contamination concerns. In some embodiments, the second epitaxial layer 240 may be deposited using vapor-phase epitaxy (VPE), ultra-high vacuum CVD (UHV-CVD), molecular beam epitaxy (MBE), and/or other suitable processes. The second epitaxial layer 240 is a heavily doped semiconductor layer to reduce parasitic resistance. For that reason, the volume of the second epitaxial layer 240 is maximized. In some instances, the second epitaxial layer 240 includes a fourth thickness T4 between about 40 nm and about 100 nm along the Z direction. While not explicitly shown in FIG. 12, the second epitaxial layer 240 may extend lengthwise for about 20 nm to about 60 nm along the Y direction. The second epitaxial layer 240 may be doped with phosphorus (P) with a dopant concentration between about $8\times10^{20}$ and about $4\times10^{22}$ atoms/cm$^3$. In terms of percentage, second epitaxial layer 240 may include between about 1% and about 10% of phosphorus (P). It is noted that the dopant concentration in the second epitaxial layer 240 is greater than the dopant concentration in the first epitaxial layer 238, whether the dopant in the first epitaxial layer 238 is phosphorus (P) or arsenic (As).

In one embodiment, the buffer semiconductor feature 236 includes undoped silicon, the first epitaxial layer 238 includes silicon doped with arsenic (Si:As), and the second epitaxial layer 240 includes silicon doped with phosphorus (Si:P). The buffer semiconductor feature 236 is spaced apart from the second epitaxial layer 240 by the first epitaxial layer 238. The first epitaxial layer 238 serves as a shielding epitaxial layer to prevent dopant diffusion from the second epitaxial layer 240 into the buffer semiconductor feature 236. The undoped buffer semiconductor feature 236 functions as a leakage reduction feature to reduce leakage current through the substrate 202. When too much dopant in the second epitaxial layer 240 is allowed to diffuse into the buffer semiconductor feature 236, the buffer semiconductor feature 236 may not function properly to reduce leakage.

The selective deposition of the first epitaxial layer 238 at block 116 is conductive to satisfactory deposition of the second epitaxial layer 240 at block 118. While theoretically the first epitaxial layer 238 may be conformally deposited on sidewalls of the channel layers 208 and the inner spacer feature 234, the deposition rate on the inner spacer feature 234 is much slower than that on the sidewalls of the channel layers 208. Because the deposition of the second epitaxial layer 240 is faster than the deposition of the first epitaxial layer 238, the deposition of the second epitaxial layer 240 tends to create voids adjacent sidewalls of the inner spacer features 234 due to the uneven growth of the first epitaxial layer 238. Voids in the second epitaxial layer 240 may reduce volume of the highly doped second epitaxial layer 240, leading to increased resistance. The voids may also induce other defects in the second epitaxial layer 240, which may also lead to increased resistance. According to the present disclosure, the first epitaxial layer 238 is selectively deposited on sidewalls of the channel layers 208 while gaps over the inner spacer features 234 are uniformly maintained. The cone-like first epitaxial layer 238 induces (111) crystalline facet along sidewalls of the inner spacer features 234. Because the deposition of the second epitaxial layer 234 tends to growth faster on the (100) crystalline facet along the Z direction, the second epitaxial layer 240 is more likely to merge directly over the inner spacer features 234 to bridge the gaps, leading to smaller or no voids adjacent the sidewalls of the inner spacer features. In this regard, it has been observed that the deposition of the second epitaxial layer 240 takes place faster along the (100) crystal facet than along the (110) or (111) crystal facet.

Figure 13:
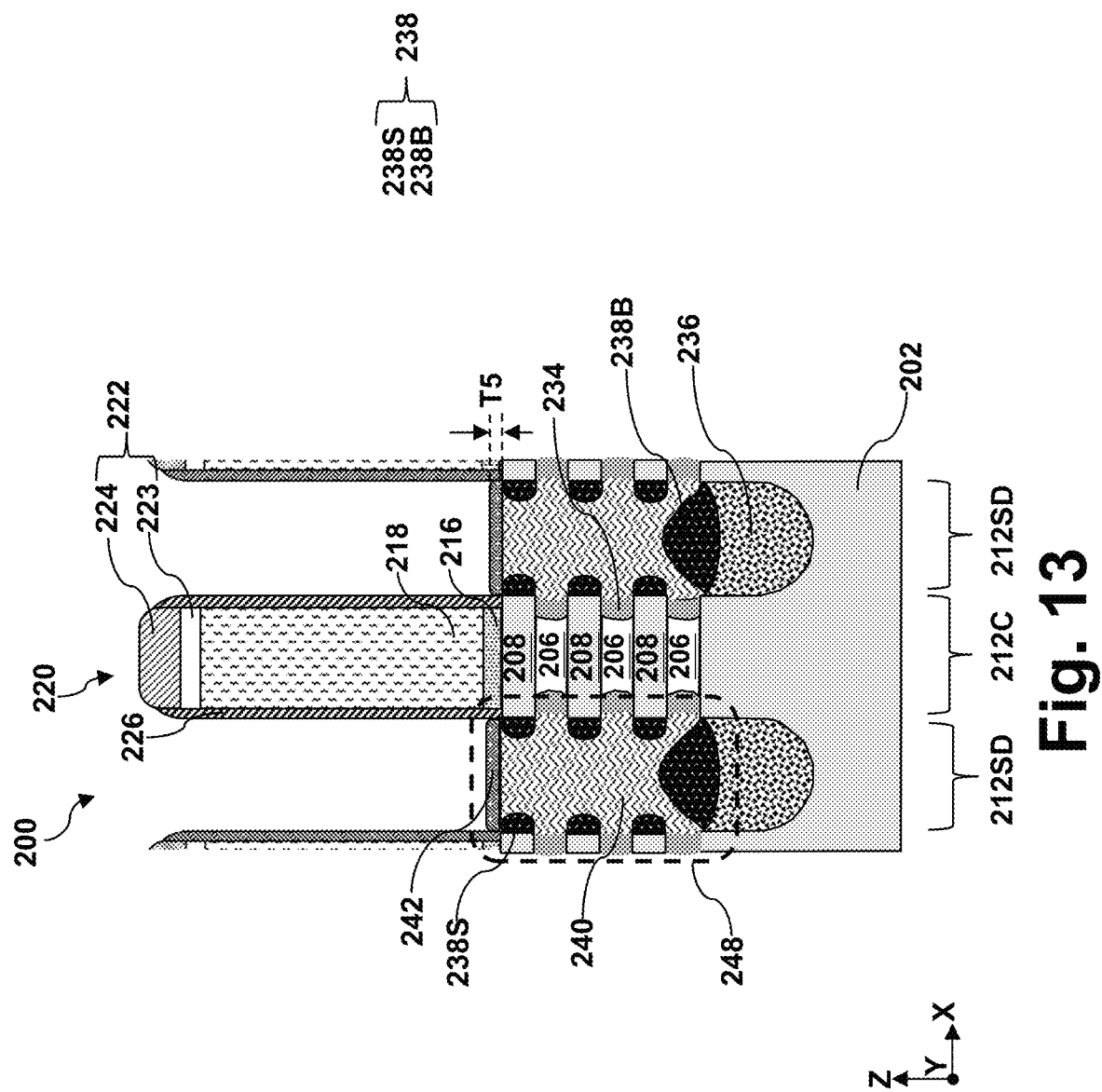

Referring to FIGS. 1 and 13, method 100 includes a block 120 where a third epitaxial layer 242 is deposited over top surfaces of the second epitaxial layer 240. In some embodiments, the deposition of the third epitaxial layer 242 at block 120 and the deposition of the second epitaxial layer 240 at block 118 are performed in situ in the same process chambers as there are less dopant contamination concerns. In some embodiments, the third epitaxial layer 242 may be deposited using vapor-phase epitaxy (VPE), ultra-high vacuum CVD (UHV-CVD), molecular beam epitaxy (MBE), and/or other suitable processes. The third epitaxial layer 242 serves as a capping epitaxial layer to prevent dopant in the second epitaxial layer 240 from diffusing into adjacent structures before source/drain contacts are formed. To properly serve as a capping epitaxial layer, the third epitaxial layer 242 may be doped with phosphorus (P), albeit at a dopant concentration smaller than that in the second epitaxial layer 240. In some instances, the third epitaxial layer 242 may have a dopant concentration between about $5 \times 10^{20}$ and about $2 \times 10^{22}$ atoms/cm$^3$. In terms of percentage, the third epitaxial layer 242 may include between about 1% and about 5% of phosphorus (P). To maximize the volume of the second epitaxial layer 240, the third epitaxial layer 242 has a fifth thickness T5 much smaller than the fourth thickness T4 of the second epitaxial layer 240. In some instances, the fifth thickness T5 may be between about 2 nm and about 10 nm along the Z direction. While not explicitly shown in FIG. 13, the third epitaxial layer 242 may extend lengthwise for about 20 nm to about 60 nm along the Y direction.

Referring to FIG. 13, the first epitaxial layer 238, the second epitaxial layer 240 and the third epitaxial layer 242 over one source/drain region 212SD may be collectively referred to as a source/drain feature 248. The source/drain feature 248 interfaces sidewalls of the channel layers 208 and a top surface of the buffer semiconductor feature 236 by way of the first epitaxial layer 238. The second epitaxial layer 240 account for a majority of a total volume of the source/drain feature 248. The second epitaxial layer 240 is spaced apart from the sidewalls of the channel layers 208 and the top surface of the buffer semiconductor feature 236 by the first epitaxial layer 238. The second epitaxial layer 240 may come in direct contact with sidewalls of the inner spacer features 234. The third epitaxial layer 242 prevents dopant diffusion from the heavily doped second epitaxial layer.

Figure 14:
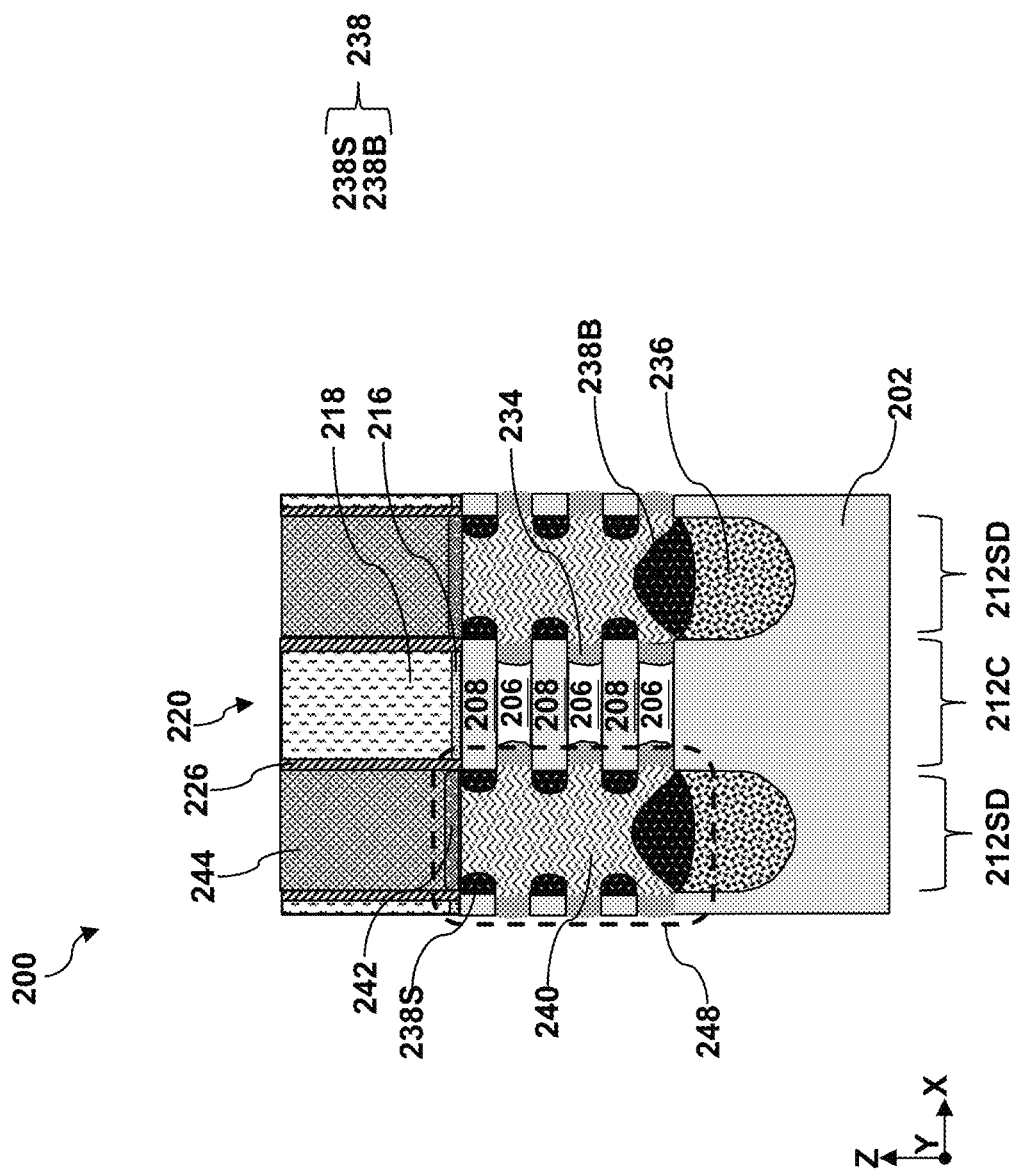

Referring to FIGS. 1 and 14-16, method 100 includes a block 122 where the dummy gate stack 220 is replaced with a gate structure 250. Block 122 may include deposition of an interlayer dielectric (ILD) layer 244 over the third epitaxial layer 242 (shown in FIG. 14), removal of the dummy gate stack 220 (shown in FIG. 15), selective removal of the sacrificial layers 206 in the channel region 212C to release the channel layers 208 as channel members 2080 (shown in FIG. 15), and formation of the gate structure 250 to wrap around each of the channel members 2080 (shown in FIG. 16). Referring to FIG. 14, the ILD layer 244 is deposited over the workpiece 200, including over the third epitaxial layer 242. In some embodiments, the ILD layer 244 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 244 may be deposited using CVD, FCVD, spin-on coating, or a suitable deposition technique. In some alternative embodiments not explicitly shown in FIG. 14, a contact etch stop layer (CESL) may be deposited over the third epitaxial layer 242 before the deposition of the ILD layer 244. The CESL may include silicon nitride. After the deposition of the ILD layer 244, the workpiece 200 may be planarized by a planarization process to expose the dummy gate stack 220. For example, the planarization process may include a chemical mechanical planarization (CMP) process. Exposure of the dummy gate stack 220 allows the removal of the dummy gate stack 220.

Figure 15:
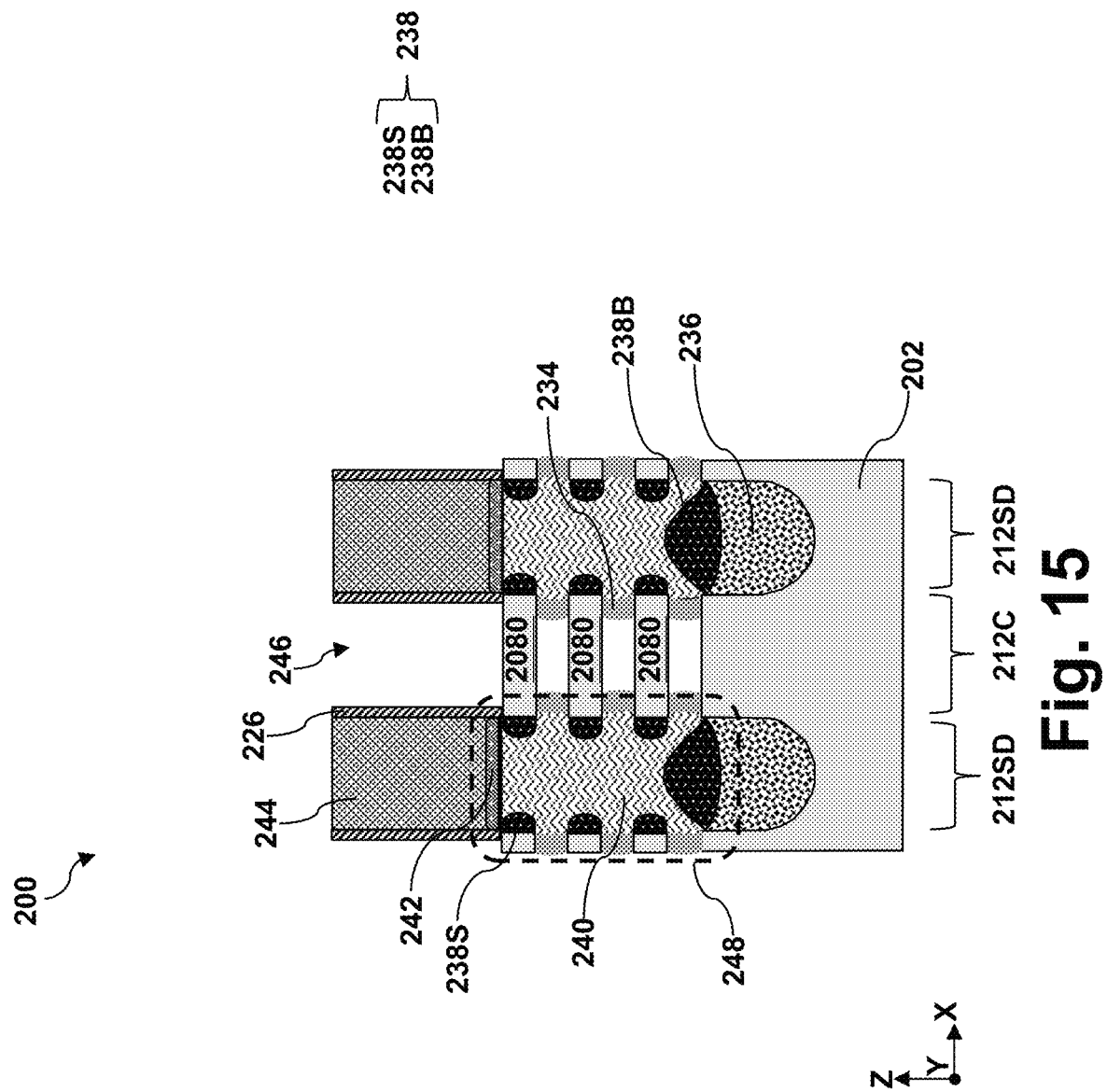

Referring to FIG. 15, the dummy gate stack 220 is removed. The removal of the dummy gate stack 220 may include one or more etching processes that are selective to the material of the dummy gate stack 220. For example, the removal of the dummy gate stack 220 may be performed using as a selective wet etch, a selective dry etch, or a combination thereof that is selective to the dummy gate stack 220. After the removal of the dummy gate stack 220, sidewalls of the channel layers 208 and the sacrificial layers 206 in the channel region 212C are exposed. Referring still to FIG. 15, after the removal of the dummy gate stack 220, the sacrificial layers 206 between the channel layers 208 in the channel region 212C are selectively removed. The selective removal of the sacrificial layers 206 releases the channel layers 208 (shown in FIG. 14) to form channel members 2080 shown in FIG. 15. The selective removal of the sacrificial layers 206 forms a gate trench 246 that includes spaces between adjacent channel members 2080. The selective removal of the sacrificial layers 206 may be implemented by selective dry etch, selective wet etch, or other selective etch processes. An example selective dry etching process may include use of one or more fluorine-based etchants, such as fluorine gas or hydrofluorocarbons. An example selective wet etching process may include an APM etch (e.g., ammonia hydroxide-hydrogen peroxide-water mixture).

Figure 16:
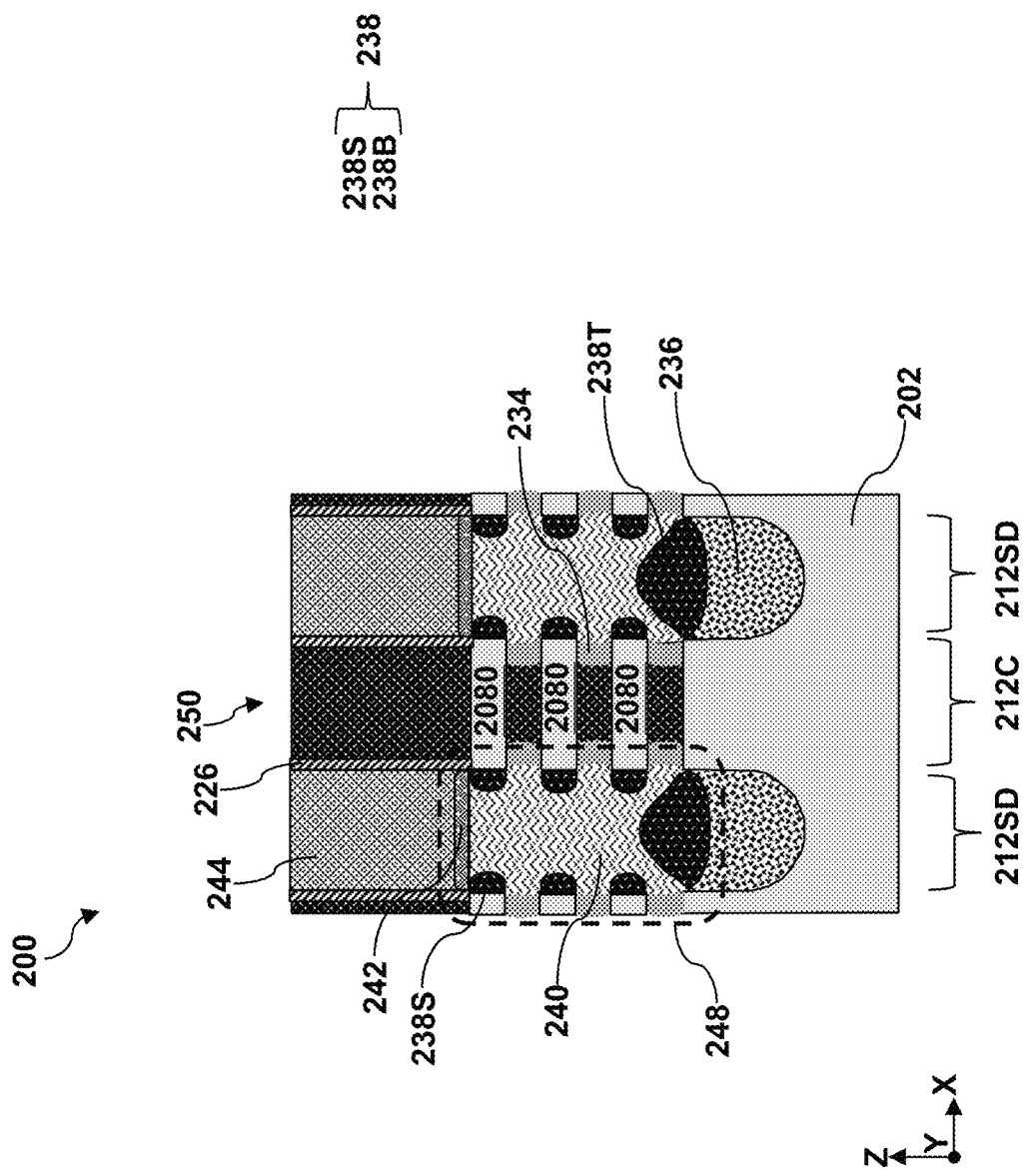

Referring to FIG. 16, after the release of the channel members 2080, the gate structure 250 is formed to wrap around each of the channel members 2080. While not explicitly shown, the gate structure 250 includes an interfacial layer interfacing the channel members 2080 and the substrate 202 in the channel region 212C, a gate dielectric layer over the interfacial layer, and a gate electrode layer over the gate dielectric layer. The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The gate dielectric layer may include a high-k dielectric material, such as hafnium oxide. Alternatively, the gate dielectric layer may include other high-K dielectric materials, such as titanium oxide (TiO$_2$), hafnium zirconium oxide (HfZrO), tantalum oxide (Ta$_2$O$_5$), hafnium silicon oxide (HfSiO$_4$), zirconium oxide (ZrO$_2$), zirconium silicon oxide (ZrSiO$_2$), lanthanum oxide (La$_2$O$_3$), aluminum oxide (Al$_2$O$_3$), zirconium oxide (ZrO), yttrium oxide (Y$_2$O$_3$), SrTiO$_3$ (STO), BaTiO$_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)TiO$_3$ (BST), silicon nitride (SiN), silicon oxynitride (SiON), combinations thereof, or other suitable material. The gate dielectric layer may be formed by ALD, physical vapor deposition (PVD), CVD, oxidation, and/or other suitable methods.

The gate electrode layer of the gate structure 250 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode layer may be formed by ALD, PVD. CVD, e-beam evaporation, or other suitable process. In various embodiments, a CMP process may be performed to remove excessive metal, thereby providing a substantially planar top surface of the gate structure. The gate structure includes portions that interpose between channel members 2080 in the channel region 212C.

Figure 17:
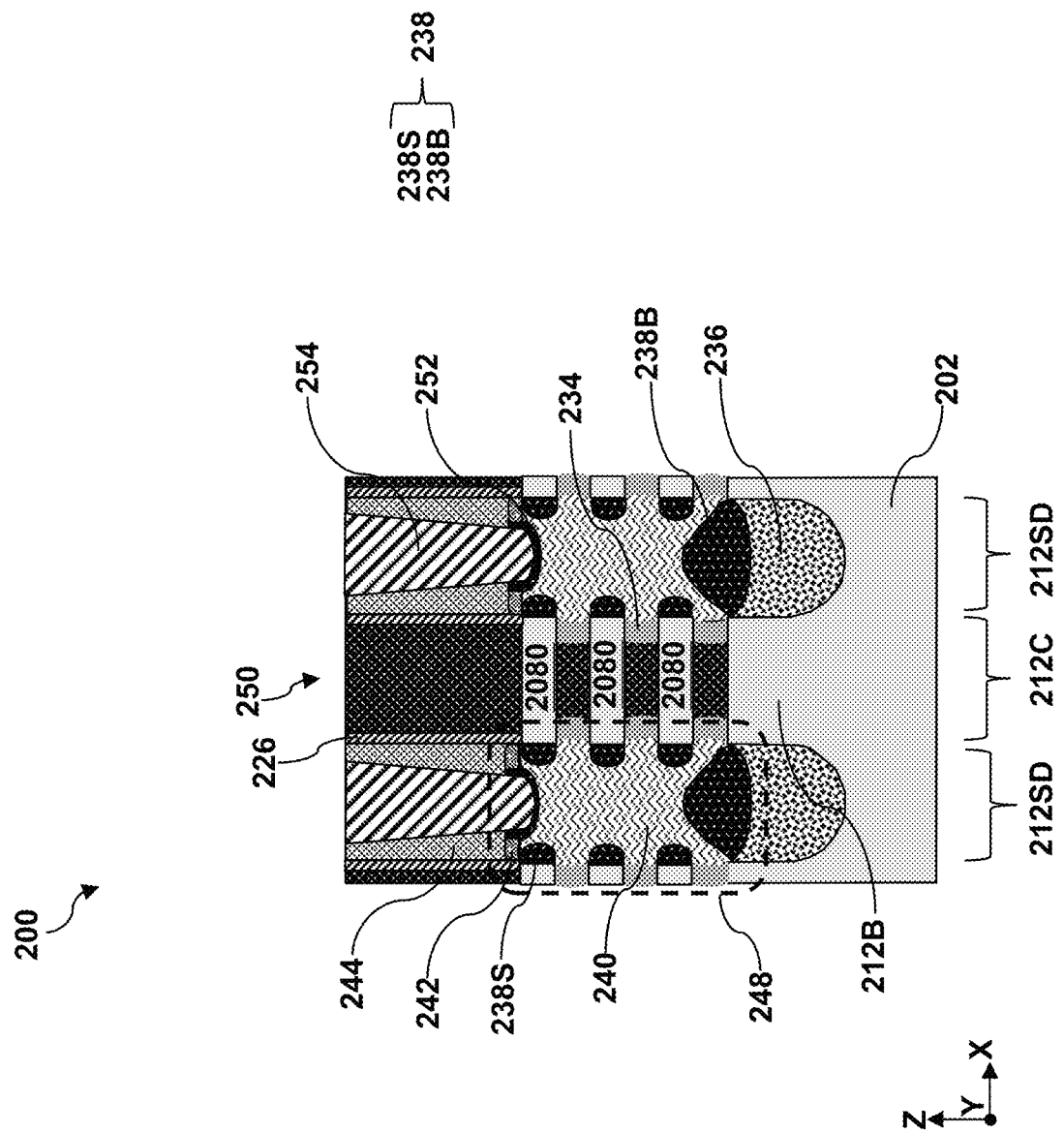

Referring to FIGS. 1 and 17, method 100 includes a block 124 where further processes are performed. Such further processes may include, for example, formation of source/drain contacts 254. Referring to FIG. 17, source/drain contact openings are formed through the ILD layer 244 and the third epitaxial layer 242 to expose a portion of the second epitaxial layer 240. A silicide layer 252 is then formed on exposed surfaces of the second epitaxial layer 240 and the third epitaxial layer 242. To form the silicide layer 252, a metal precursor layer, such as a titanium layer or a transition metal layer, is deposited over the source/drain contact openings. The workpiece 200 is then annealed to bring about silicidation reaction between the metal precursor layer and the second epitaxial layer 240 and the third epitaxial layer 242. In some embodiments, the silicide layer 252 includes titanium silicide (TiSi) or a transition metal silicide. The excess metal precursor layer that does not turn into silicide may be removed. After the formation of the silicide layer 252, a source/drain contact 254 is formed in the source/drain contact opening. The source/drain contact 254 may include cobalt (Co), nickel (Ni), titanium (Ti), or tungsten (W) and may be deposited using PVD or a suitable deposition method.

Figure 18:
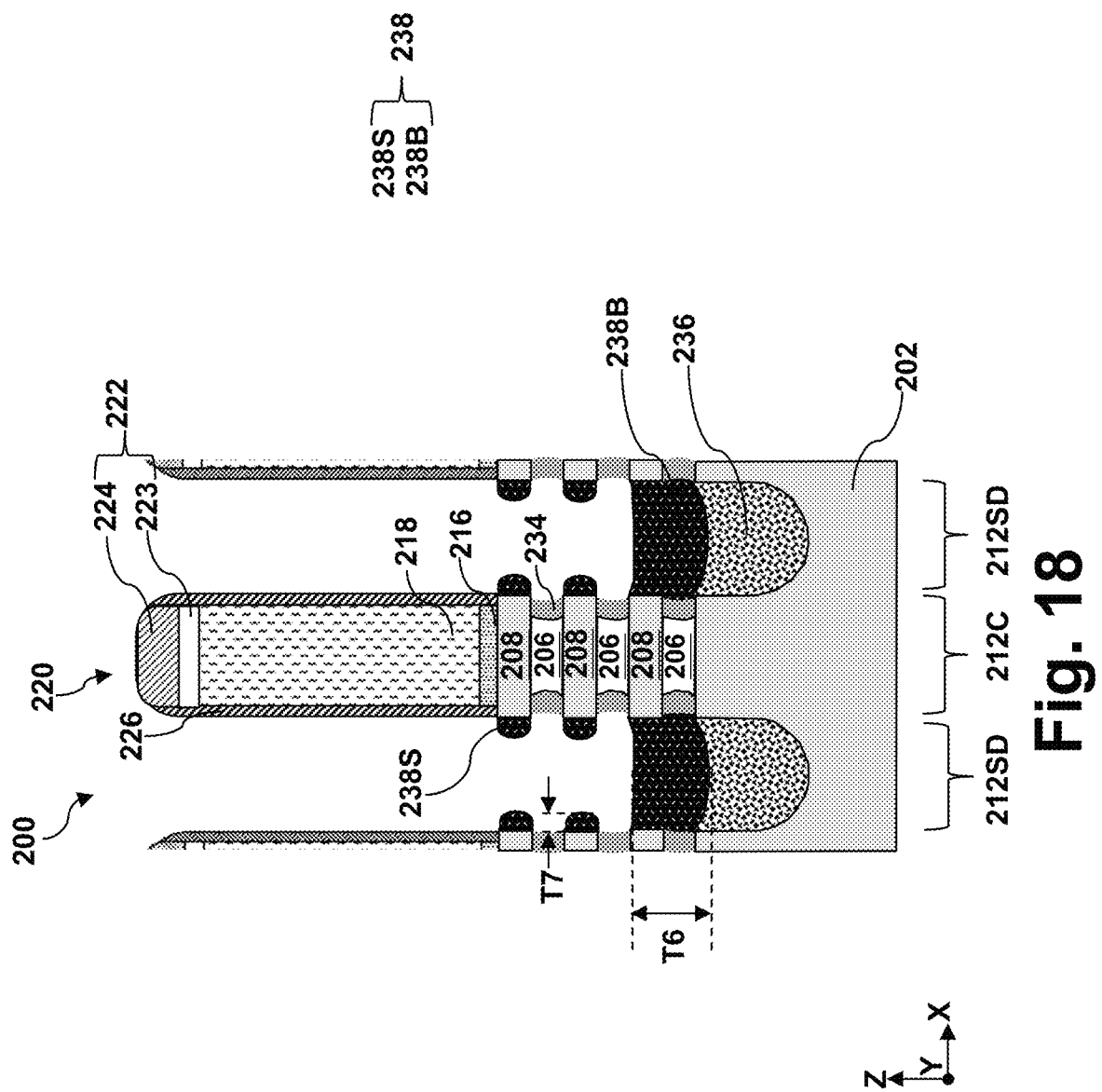

FIGS. 18-24 illustrate alternative embodiments of the present disclosure. For the case of reference, the same reference numerals are used to refer to the first epitaxial layer, the second epitaxial layer and the third epitaxial layer even though the shapes of the first epitaxial layer and the second epitaxial layer in these alternative embodiments may be different. Reference is first made to FIG. 18. In some embodiments, the deposition of the first epitaxial layer 238 at block 116 of method 100 is configured to last longer such that bottom portion 238B of the first epitaxial layer 238 merges over the bottommost inner spacer features 234 and that the bottom portion 238B completely covers sidewalls of the bottommost inner spacer features 234 and sidewalls of the bottommost channel layers 208 (which will form the bottommost channel members 2080). That said, the first epitaxial layer 238 remains spaced apart from the substrate 202. As illustrated in FIG. 18, in this alternative embodiment, the bottom portion 238 may have a substantially flat top surface that is substantially coplanar with a top surface of the bottommost channel layer 208. Because the first epitaxial layer 238 is less conductive than the second epitaxial layer 240, the alternative embodiment shown in FIG. 18 may have less leakage through the base fin structure 212B. At the same time, the bottommost channel layer 208 may experience increased resistance because the volume of the second epitaxial layer 240 is reduced. In this regard, the improved leakage may come at a price of slightly increased resistance. The selection between the foregoing embodiments and these alternative embodiments is therefore a design choice. In this alternative embodiment, the bottom portion 238B may have a sixth thickness T6 between about 5 nm and about 20 nm along the Z direction and the sidewall portions 238S may have a seventh thickness T7 between about 4 nm and about 8 nm along the X direction. It is noted that the sixth thickness T6 is greater than the second thickness T2 and the seventh thickness T7 is greater than the third thickness T3 because the first epitaxial layer 238 in the alternative embodiment is allowed to grow to a greater thickness.

Figure 19:
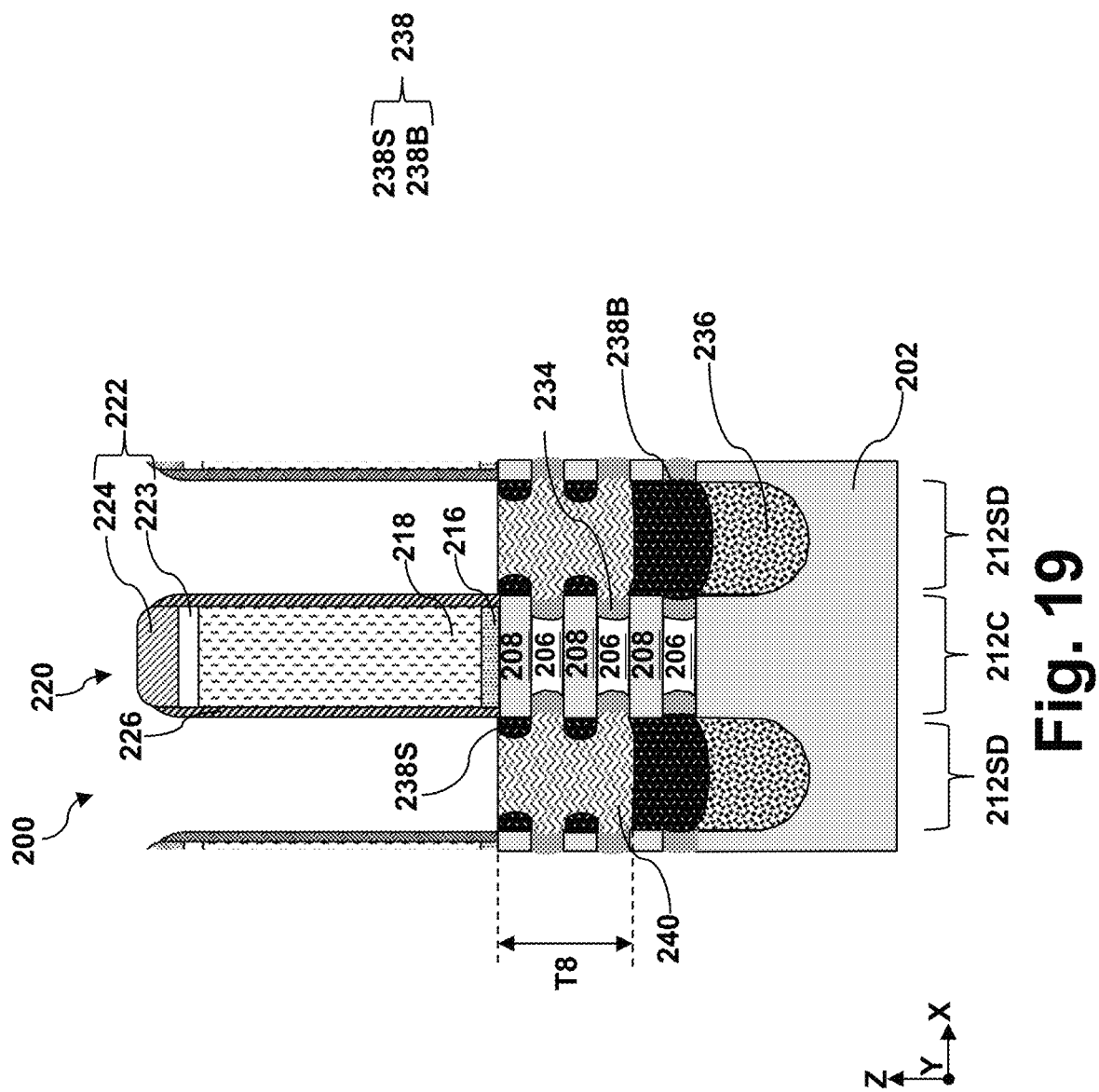

Referring then to FIG. 19, in the alternative embodiments, the deposition of the second epitaxial layer 240 at block 118 of method 100 may result in a second epitaxial layer 240 with an eighth thickness T8 smaller than the fourth thickness T4 (shown in FIG. 12) because the sixth thickness T6 is greater than the second thickness T2. In some instances, the eighth thickness T8 may be between about 35 nm and about 95 nm. In the alternative embodiment, the deposition of the third epitaxial layer 242 at block 120 of method 100 is largely unaffected. The third epitaxial layer 242 in FIG. 20 may have the fifth thickness T5, which may be between about 2 nm and about 10 nm.

Figure 20:
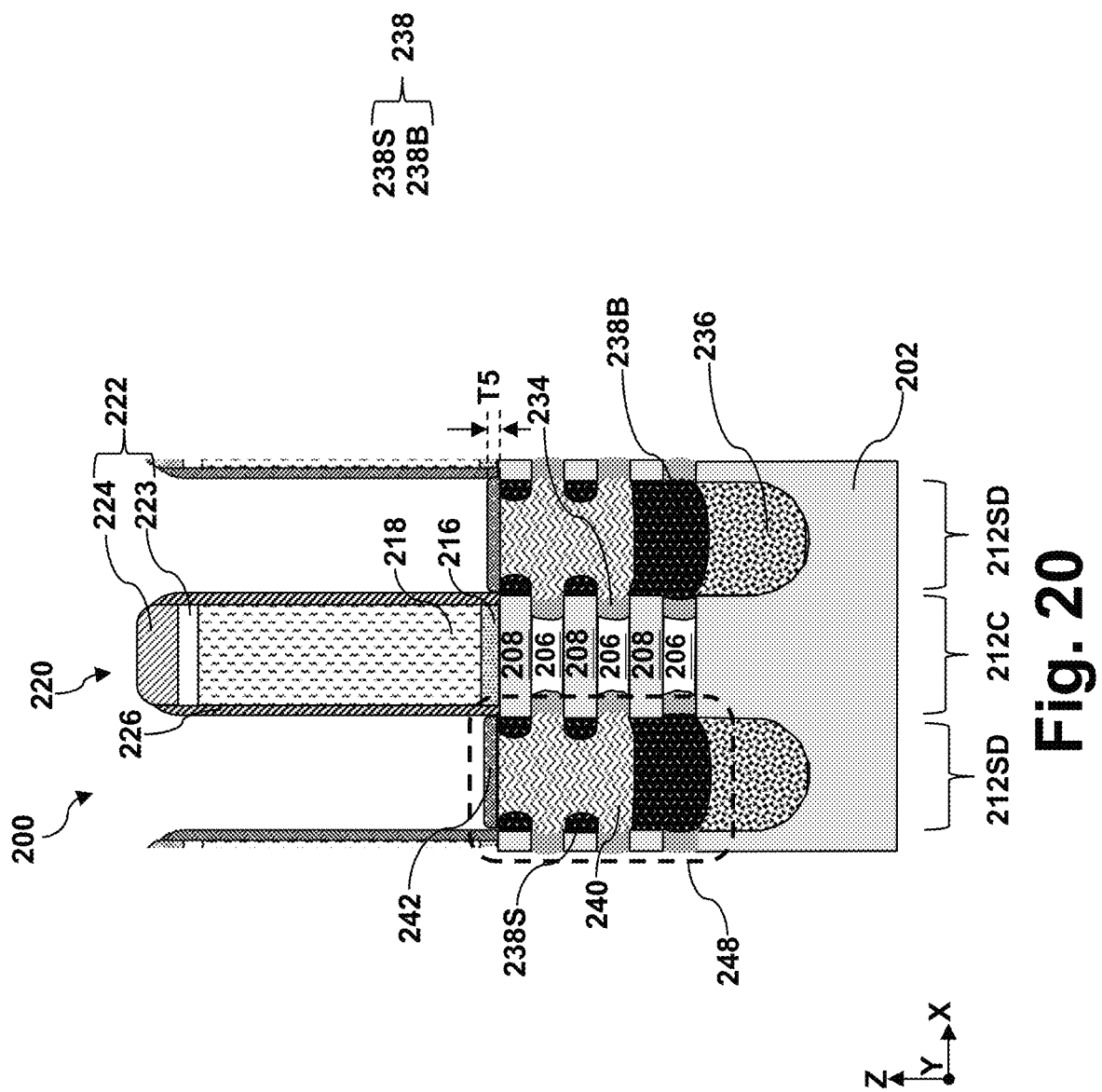
Figure 21:
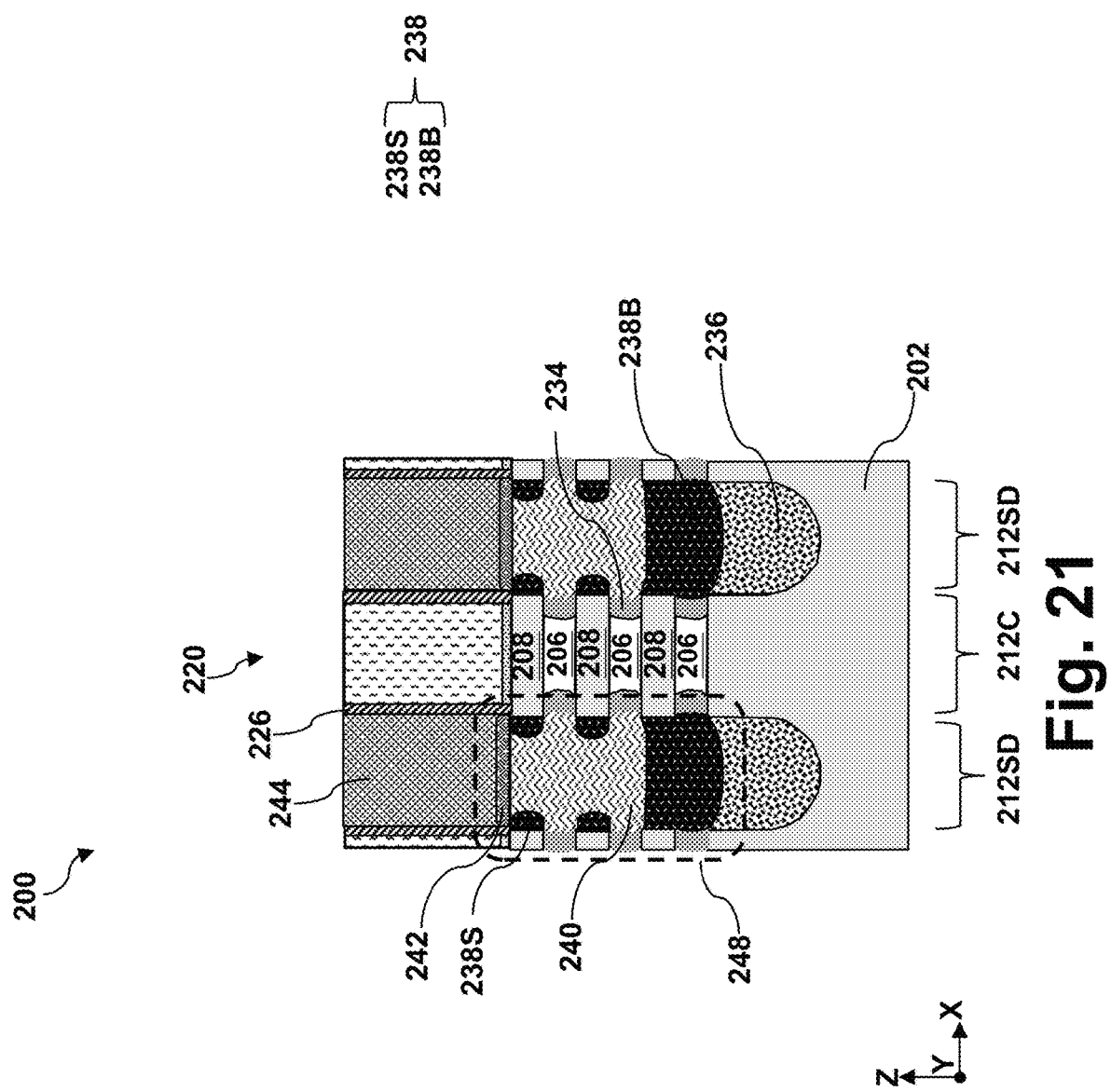
Figure 22:
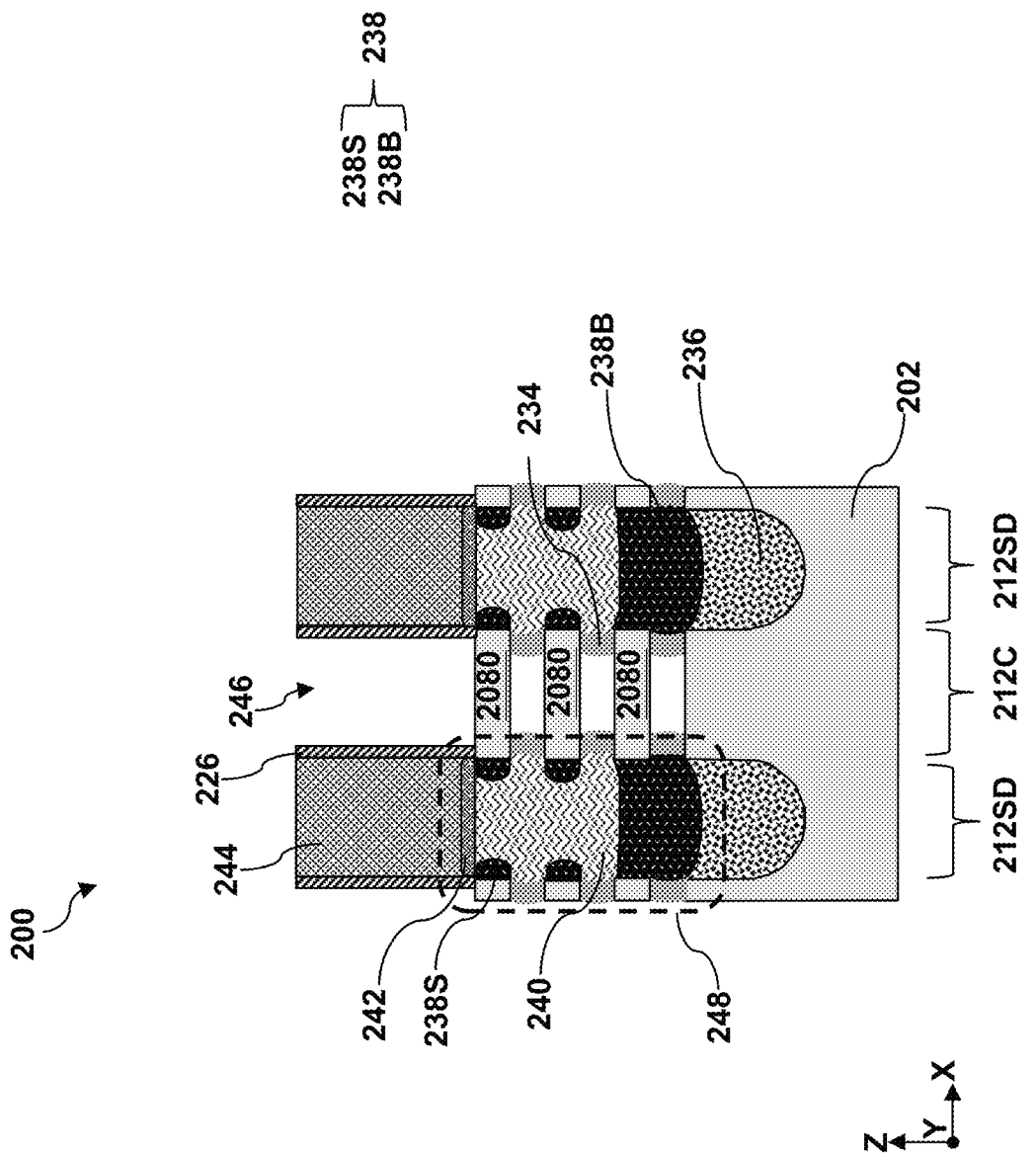
Figure 23:
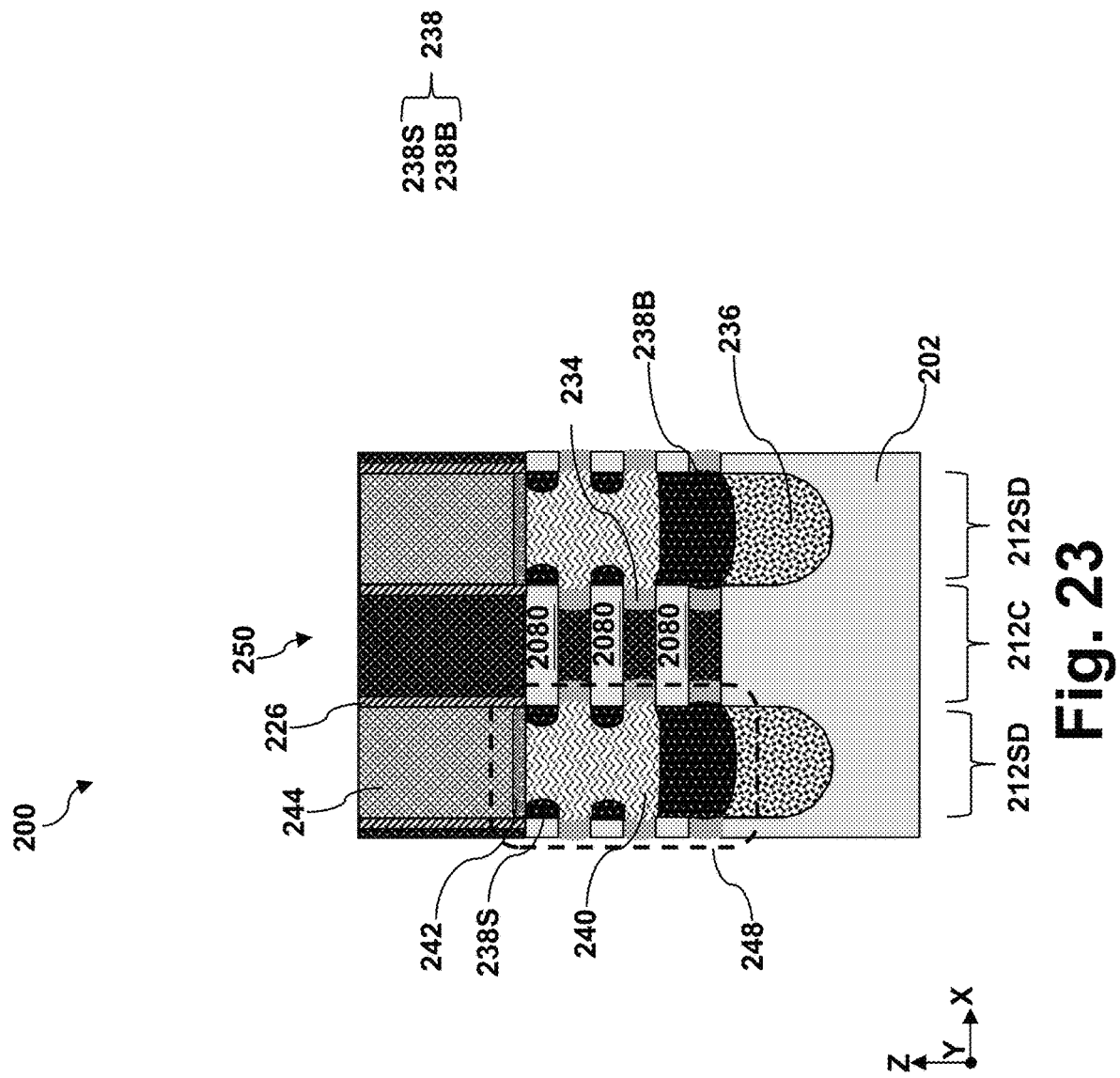
Figure 24:
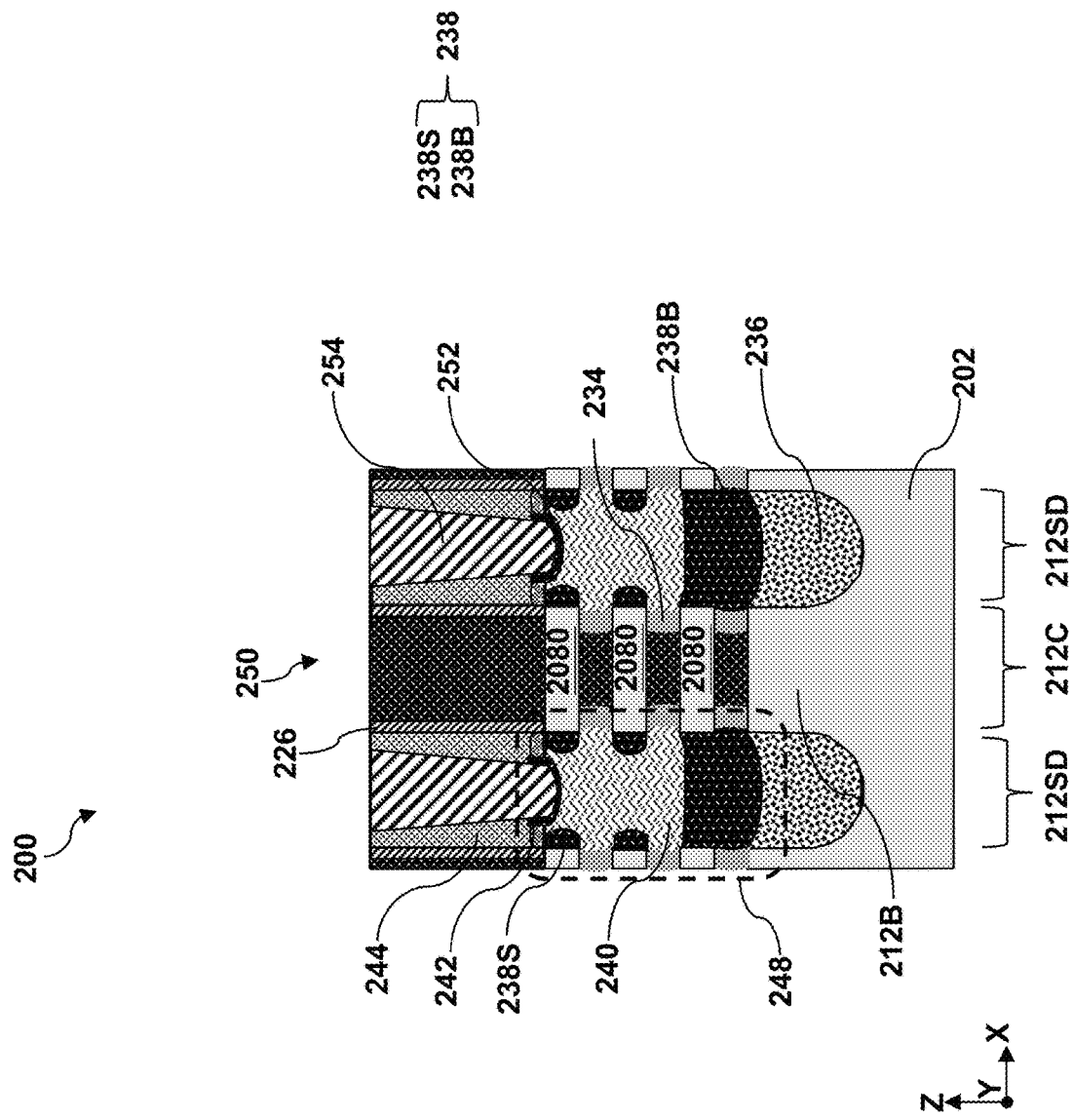

FIGS. 21, 22, 23, and 24 illustrate performance of operations 122 and 124 to the workpiece 200 shown in FIG. 20. As these operations and the features formed thereby are not particularly affected by the different configuration of the first epitaxial layer 238, detailed description of FIGS. 21, 22, 23, and 24 is omitted for brevity.

Although not intended to be limiting, one or more embodiments of the present disclosure provide many benefits to a semiconductor device and the formation thereof. For example, embodiments of the present disclosure include selectively deposition of the first epitaxial layer to maintain gaps over inner spacer features. The second epitaxial layer is then deposited along the (100) facet of the first epitaxial layer to merge directly over the inner spacer features. The method of the present disclosure may reduce void formation in the source/drain features, increase the volume of the highly doped second epitaxial layer, and reduce contact resistance.

In one exemplary aspect, the present disclosure is directed to a method. The method includes forming over a substrate a fin-shaped structure that includes a plurality of channel layers interleaved by a plurality of sacrificial layers, recessing a source/drain region of the fin-shaped structure to form a source/drain recess that extends into the substrate and exposes a portion of the substrate, selectively and partially recessing sidewalls of the plurality of sacrificial layers to form inner spacer recesses, forming inner spacers in the inner spacer recesses, selectively forming a buffer semiconductor layer on the exposed portion of the substrate, selectively depositing a first epitaxial layer on sidewalls of the plurality of channel layer and the buffer semiconductor layer such that a top surface of the buffer semiconductor layer is completely covered by the first epitaxial layer, and depositing a second epitaxial layer over the first epitaxial layer and the inner spacers.

In some embodiments, after the selectively depositing of the first epitaxial layer, the first epitaxial layer includes a bottom portion disposed on the buffer semiconductor layer and the bottom portion includes a cone-like profile. In some implementations, after the selectively depositing of the first epitaxial layer, the first epitaxial layer includes a bottom portion that completely covers sidewalls of bottommost ones of the inner spacers and the bottom portion includes a top surface that is substantially flat. In some embodiments, the first epitaxial layer includes a first dopant and the second epitaxial layer includes a second dopant different from the first dopant. In some instances, the first dopant includes arsenic and the second dopant includes phosphorus. In some embodiments, the buffer semiconductor layer includes an undoped semiconductor material. In some instances, the selectively depositing of the first epitaxial layer includes an etch component and a deposition component. In some embodiments, the selectively depositing of the first epitaxial layer includes a process pressure between about 10 Torr and about 300 Torr. In some implementations, the selectively depositing of the first epitaxial layer includes a process temperature between about 600° C. and about 700° C. In some embodiments, the method may further include, after the depositing of the second epitaxial layer, depositing a third epitaxial layer on the second epitaxial layer.

In another exemplary aspect, the present disclosure is directed to a method. The method includes forming over a substrate a stack that includes a plurality of channel layers interleaved by a plurality of sacrificial layers, patterning the stack and the substrate into a fin-shaped structure, forming a dummy gate stack over a channel region of the fin-shaped structure, recessing a source/drain region of the fin-shaped structure to expose a portion of the substrate, the source/drain region being adjacent the channel region, after the recessing of the source/drain region, selectively and partially recessing sidewalls of the plurality of sacrificial layers to form inner spacer recesses, forming inner spacers in the inner spacer recesses, selectively forming an undoped semiconductor layer on the exposed portion of the substrate, selectively depositing a shielding epitaxial layer on sidewalls of the plurality of channel layer and surfaces of the undoped semiconductor layer, depositing a heavily doped epitaxial layer over the shielding epitaxial layer and the inner spacers such that the heavily doped epitaxial layer is spaced apart from the undoped semiconductor layer by the shielding epitaxial layer, and depositing a capping epitaxial layer over the heavily doped epitaxial layer.

In some embodiments, the undoped semiconductor layer includes undoped silicon or undoped silicon germanium. In some implementations, the shielding epitaxial layer is doped with arsenic and the heavily doped epitaxial layer is doped with phosphorus. In some implementations, a concentration of arsenic in the shielding epitaxial layer is between about $5\times10^{20}$ atoms/cm$^3$ and about $2\times10^{21}$ atoms/cm$^3$ and a concentration of phosphorus in the heavily doped epitaxial layer is between about $1\times10^{21}$ atoms/cm$^3$ and about $4\times10^{22}$ atoms/cm$^3$. In some implementations, the selectively depositing of the shielding epitaxial layer includes a process pressure between about 10 Torr and about 300 Torr and the selectively depositing of the shielding epitaxial layer includes a process temperature between about 600° C. and about 700° C.

In yet another exemplary aspect, the present disclosure is directed to a semiconductor structure. The semiconductor structure includes a first undoped semiconductor feature and a second undoped semiconductor feature over a substrate, a fin structure arising from the substrate and sandwiched between the first undoped semiconductor feature and the second undoped semiconductor feature along a first direction, a plurality of nanostructures disposed over the fin structure, a first source/drain feature disposed on the first undoped semiconductor feature, and a second source/drain feature disposed on the second undoped semiconductor feature. The plurality of nanostructures extending between the first source/drain feature and the second source/drain feature along the first direction. The first source/drain feature includes a first epitaxial layer covering a top surface of the first undoped semiconductor feature and sidewalls of the plurality of nanostructures and a second epitaxial layer spaced apart from the first undoped semiconductor feature and the sidewalls of the plurality of nanostructures.

In some embodiments, the first undoped semiconductor feature and the second undoped semiconductor feature include undoped silicon or undoped silicon germanium. In some implementations, the first epitaxial layer includes a bottom portion disposed directly on the first undoped semiconductor feature and the bottom portion includes a cone-like profile when viewed along a second direction perpendicular to the first direction. In some embodiments, the semiconductor structure may further include a gate structure wrapping around each of the plurality of nanostructures and a plurality of inner spacers sandwiched between the gate structure and the first source/drain feature along the first direction. In some implementations, the first epitaxial layer includes a bottom portion disposed directly on the first undoped semiconductor feature and the bottom portion completely covers a bottommost one of the plurality of inner spacers and includes a substantially flat top surface.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a fin-shaped structure over a substrate, the fin-shaped structure comprising a plurality of channel layers interleaved by a plurality of sacrificial layers;
   recessing a source/drain region of the fin-shaped structure to form a source/drain recess that extends into the substrate and exposes a portion of the substrate;
   selectively and partially recessing sidewalls of the plurality of sacrificial layers to form inner spacer recesses;
   forming inner spacers in the inner spacer recesses;
   selectively forming a buffer semiconductor layer on the exposed portion of the substrate;
   selectively depositing a first epitaxial layer on sidewalls of the plurality of channel layer and the buffer semiconductor layer such that a top surface of the buffer semiconductor layer is completely covered by the first epitaxial layer; and
   depositing a second epitaxial layer over the first epitaxial layer and the inner spacers.

2. The method of claim 1,
   wherein, after the selectively depositing of the first epitaxial layer, the first epitaxial layer comprises a bottom portion disposed on the buffer semiconductor layer,
   wherein the bottom portion comprises a cone-like profile.

3. The method of claim 1,
wherein, after the selectively depositing of the first epitaxial layer, the first epitaxial layer comprises a bottom portion that completely covers sidewalls of bottommost ones of the inner spacers,
wherein the bottom portion comprises a top surface that is substantially flat.

4. The method of claim 1,
wherein the first epitaxial layer comprises a first dopant,
wherein the second epitaxial layer comprises a second dopant different from the first dopant.

5. The method of claim 4,
wherein the first dopant comprises arsenic,
wherein the second dopant comprises phosphorus.

6. The method of claim 4, wherein the buffer semiconductor layer comprises an undoped semiconductor material.

7. The method of claim 1, wherein the selectively depositing of the first epitaxial layer comprises an etch component and a deposition component.

8. The method of claim 1, wherein the selectively depositing of the first epitaxial layer comprises a process pressure between about 10 Torr and about 300 Torr.

9. The method of claim 1, wherein the selectively depositing of the first epitaxial layer comprises a process temperature between about 600° C. and about 700° C.

10. The method of claim 1, further comprising:
after the depositing of the second epitaxial layer, depositing a third epitaxial layer on the second epitaxial layer.

11. A method, comprising:
forming a stack over a substrate, the stack comprising a plurality of channel layers interleaved by a plurality of sacrificial layers;
patterning the stack and the substrate into a fin-shaped structure;
forming a dummy gate stack over a channel region of the fin-shaped structure;
recessing a source/drain region of the fin-shaped structure to expose a portion of the substrate, the source/drain region being adjacent the channel region;
after the recessing of the source/drain region, selectively and partially recessing sidewalls of the plurality of sacrificial layers to form inner spacer recesses;
forming inner spacers in the inner spacer recesses;
selectively forming an undoped semiconductor layer on the exposed portion of the substrate;
selectively depositing a shielding epitaxial layer on sidewalls of the plurality of channel layer and surfaces of the undoped semiconductor layer;
depositing a heavily doped epitaxial layer over the shielding epitaxial layer and the inner spacers such that the heavily doped epitaxial layer is spaced apart from the undoped semiconductor layer by the shielding epitaxial layer; and
depositing a capping epitaxial layer over the heavily doped epitaxial layer.

12. The method of claim 11, wherein the undoped semiconductor layer comprises undoped silicon or undoped silicon germanium.

13. The method of claim 11,
wherein the shielding epitaxial layer is doped with arsenic,
wherein the heavily doped epitaxial layer is doped with phosphorus.

14. The method of claim 13
wherein a concentration of arsenic in the shielding epitaxial layer is between about $5\times10^{20}$ atoms/cm$^3$ and about $2\times10^{21}$ atoms/cm$^3$,
wherein a concentration of phosphorus in the heavily doped epitaxial layer is between about $1\times10^{21}$ atoms/cm$^3$ and about $4\times10^{22}$ atoms/cm$^3$.

15. The method of claim 11,
wherein the selectively depositing of the shielding epitaxial layer comprises a process pressure between about 10 Torr and about 300 Torr,
wherein the selectively depositing of the shielding epitaxial layer comprises a process temperature between about 600° C. and about 700° C.

16. A method, comprising:
forming a fin-shaped structure over a substrate, the fin-shaped structure comprising a plurality of channel layers interleaved by a plurality of sacrificial layers;
recessing a source/drain region of the fin-shaped structure to form a source/drain recess that extends into the substrate and exposes a portion of the substrate;
selectively and partially recessing sidewalls of the plurality of sacrificial layers to form inner spacer recesses;
forming inner spacers in the inner spacer recesses;
selectively forming an undoped semiconductor layer on the exposed portion of the substrate;
selectively depositing a first epitaxial layer on sidewalls of the plurality of channel layer and the undoped semiconductor layer; and
depositing a second epitaxial layer over the first epitaxial layer and the inner spacers,
wherein the selectively forming of the undoped semiconductor layer is performed in a first process chamber,
wherein the selectively depositing the first epitaxial layer and the depositing of the second epitaxial layer are performed in a second process chamber different from the first process chamber.

17. The method of claim 16, wherein the selectively depositing of the first epitaxial layer comprises a growth-etch deposition process.

18. The method of claim 17, wherein the growth-etch deposition process comprises between about 2 and about 5 growth cycles and between about 2 and about 5 etch cycles.

19. The method of claim 16,
wherein the first epitaxial layer comprises a bottom portion disposed on the undoped semiconductor layer and a sidewall portion disposed on sidewalls of the plurality of channel layers,
wherein the bottom portion comprises a thickness between about 5 nm and about 20 nm,
wherein the sidewall portion comprises a thickness between about 2 nm and about 5 nm.

20. The method of claim 19,
wherein the plurality of channel layers extend lengthwise along a first direction,
wherein, when viewed along a second direction perpendicular to the first direction, the bottom portion comprises a cone-like profile.

* * * * *